US009628104B2

(12) United States Patent
Wang et al.

(10) Patent No.: US 9,628,104 B2
(45) Date of Patent: Apr. 18, 2017

(54) HIGH RESOLUTION SIGMA DELTA MODULATOR FOR CAPACITANCE SENSOR TERMINAL DISPLACEMENT MEASUREMENT

(71) Applicant: Rosemount Inc., Shakopee, MN (US)

(72) Inventors: Rongtai Wang, Eden Prairie, MN (US); John Paul Schulte, Eden Prairie, MN (US)

(73) Assignee: Rosemount Inc., Shakopee, MN (US)

( * ) Notice: Subject to any disclaimer, the term of this patent is extended or adjusted under 35 U.S.C. 154(b) by 95 days.

(21) Appl. No.: 14/657,323

(22) Filed: Mar. 13, 2015

(65) Prior Publication Data

US 2016/0265995 A1 Sep. 15, 2016

(51) Int. Cl.
*G01L 9/12* (2006.01)
*H03M 3/00* (2006.01)
*G01D 5/24* (2006.01)

(52) U.S. Cl.
CPC ................ *H03M 3/39* (2013.01); *G01D 5/24* (2013.01); *G01L 9/12* (2013.01); *H03M 3/494* (2013.01); *H03M 3/356* (2013.01); *H03M 3/376* (2013.01)

(58) Field of Classification Search
None
See application file for complete search history.

(56) References Cited

U.S. PATENT DOCUMENTS 6,452,521 B1 9/2002 Wang et al.
6,509,746 B1 1/2003 Wang
6,516,672 B2 2/2003 Wang
6,684,711 B2 2/2004 Wang
6,720,777 B2 4/2004 Wang
6,768,319 B2 7/2004 Wang
6,834,258 B2 12/2004 Schulte et al.
6,873,277 B1 3/2005 Frick
6,970,126 B1 * 11/2005 O'Dowd ................ H03M 3/34 341/143
7,236,113 B1 * 6/2007 Wang ....................... G01D 5/24 324/548
7,495,451 B2 2/2009 Krouth et al.
2001/0020850 A1 * 9/2001 McIntosh .............. B81B 3/0086 324/519
2003/0155936 A1 8/2003 Wang
2005/0062628 A1 3/2005 Frick
2007/0236373 A1 10/2007 Hellwig et al.
2008/0111714 A1 * 5/2008 Kremin ................... G06F 3/044 341/33
2008/0252621 A1 * 10/2008 Shipton ................ G01D 5/3473 345/179

(Continued)

OTHER PUBLICATIONS

Written Opinion & International Search Report, for PCT Patent Application No. PCT/US2016/022140, dated Nov. 10, 2016, 9 pages.

*Primary Examiner* — Andre Allen
(74) *Attorney, Agent, or Firm* — Kinney & Lange, P.A.

(57) ABSTRACT

A single plate capacitance sensor includes a sensor capacitor and a reference capacitor that share common plate. A capacitance-to-digital sigma delta modulator provides separate sensor excitation and reference excitation signals to the sensor capacitor and the reference capacitor to provide high resolution detection. Programmable ratio-metric excitation voltages and adaptive excitation voltage sources can be used to enhance modulator performance.

17 Claims, 20 Drawing Sheets

(56) References Cited

U.S. PATENT DOCUMENTS

| | | | | |
|---|---|---|---|---|
| 2012/0177211 | A1 | 7/2012 | Yamkovoy et al. | |
| 2012/0177215 | A1 | 7/2012 | Bose et al. | |
| 2014/0241843 | A1 | 8/2014 | Golda et al. | |
| 2014/0241844 | A1 | 8/2014 | Golda et al. | |
| 2014/0266256 | A1 | 9/2014 | Cagdaser et al. | |
| 2015/0295587 | A1* | 10/2015 | Garcia Gonzalez .. | H03M 3/356<br>341/121 |
| 2016/0182081 | A1* | 6/2016 | Perrott .................. | G01N 27/26<br>341/143 |

* cited by examiner

HIGH RESOLUTION SIGMA DELTA MODULATOR FOR CAPACITANCE SENSOR TERMINAL DISPLACEMENT MEASUREMENT

BACKGROUND

The present invention relates capacitance type sensors and to the conversion of the variable capacitance of the sensor to a digital value.

Capacitance sensors have found a wide range of applications. Capacitance sensors are used for sensing pressure, acceleration, flow, humidity, proximity, angle, rotation, as well as human interface sensing applications. For example, capacitance sensors are used for differential pressure measurement as well as absolute pressure measurement.

The variable capacitance produced by a capacitance sensor must be converted to an electrical signal that can be processed to produce a measurement output. In many cases, it is desirable to produce the electrical signal as a digital value that represents the variable capacitance, so that further signal processing can be done with digital circuitry rather than analog circuitry.

Capacitance-to-digital (C/D) converters using sigma delta modulators have been used in conjunction with capacitance sensors. One example is the use of sigma delta modulators for C/D conversion is in conjunction with capacitance pressure sensors.

SUMMARY

In one embodiment, a sensor circuit includes a terminal displacement capacitance sensor and a capacitance-to-digital (C/D) sigma delta modulator. The capacitance sensor includes a sensor capacitor and a reference capacitor. A first terminal is connected to the sensor capacitor, second terminal is connected to the reference capacitor, and a common terminal is connected to both the sensor capacitor and the reference capacitor. The sigma delta modulator includes an integrator, a quantizer, and an excitation signal generator. The integrator has an input connected to the common terminal of the capacitance sensor and has an output connected to the quantizer. The output of the quantizer is a pulse code modulated output signal that is a function of the capacitance of the sensor capacitor and capacitance of the reference capacitor. The excitation signal generator provides a sensor excitation signal to the first terminal and a reference excitation signal to the second terminal of the capacitance sensor.

DETAILED DESCRIPTION

Introduction

Figure 1A:
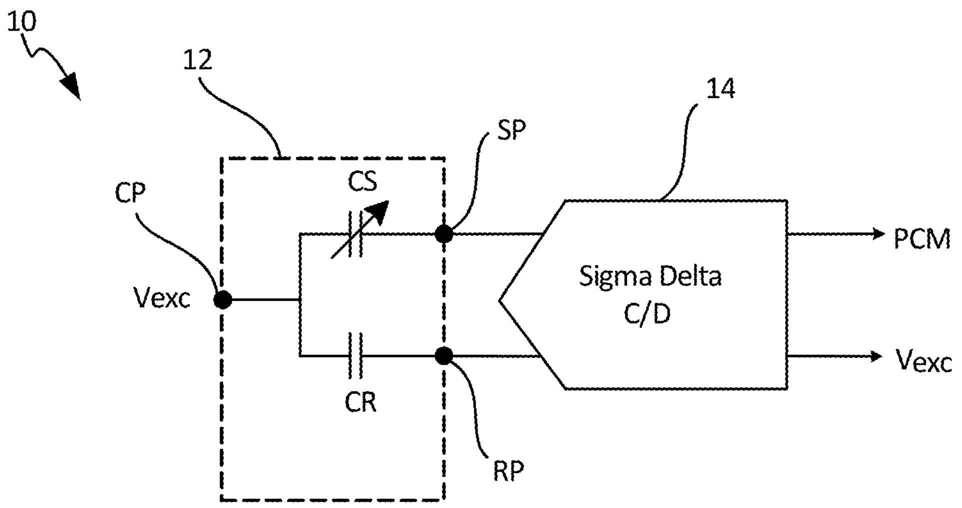
FIGS. 1A and 1B illustrate alternative excitation schemes for a terminal displacement capacitance sensor connected to a sigma delta modulator of a C/D converter.

Sensor Circuit 10 (FIG. 1A)

Figure 1B:
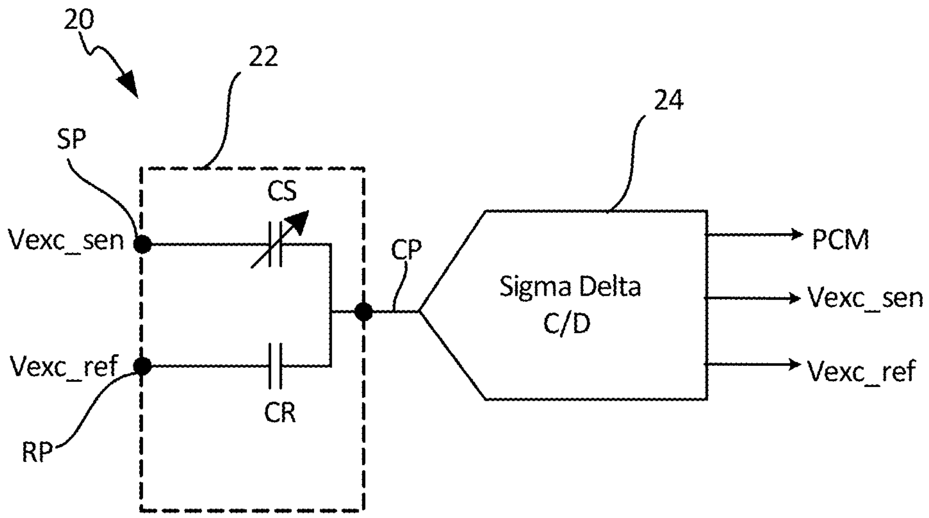

FIGS. 1A and 1B show two alternative capacitance-to-digital (C/D) excitation schemes for a single plate terminal displacement capacitance sensor. A terminal displacement capacitance sensor is one in which the spacing between the plates forming the sensor change in relation to the sensed parameter. Thus the capacitance of the sensor changes in relation to the sensed parameter. FIG. 1A shows sensor circuit 10, which includes capacitance sensor 12 and capacitance-to-digital (C/D) sigma delta modulator 14. Sensor 12 includes sensor capacitor CS and reference capacitor CR, which share a common plate. Sensor 12 has three terminals, common plate terminal CP, sensor plate terminal SP, and reference plate terminal RP. Terminals SP and RP are connected to inputs of modulator 14. Common plate terminal CP receives a single two-phase excitation signal $V_{exc}$ that excites both sensor capacitor CS and reference capacitor CR. Modulator 14 produces a pulse code modulated output signal PCM and excitation signal $V_{exc}$.

Sensor circuit 10 produces a digitized signal (output signal PCM) from which a capacitance of sensor capacitor CS can be determined. When high resolution pressure measurement is required, the digitized signal produced by modulator 14 has been found to be deficient in several characteristics.

First, the digitized signal is nonlinear with pressure. This complicates signal compensation and makes resolution performance dependent on applied pressure.

Second, the digitized signal results in low utilization of analog-to-digital (A/D) converter range. This contributes to poor resolution due to the low sensitivity of the output of modulator 14 with respect to the pressure input to sensor 12. The sensitivity is lowest near the zero pressure input condition to sensor 12.

Third, the excitation signal has a low signal level. This contributes to poor resolution because the driven sensor signals are relatively low compared to the intrinsic thermal noise within sensor circuit 10.

Some applications of sensor 12, such as dual absolute differential pressure sensing, require high resolution signal detection. In those applications, circuit 10 is not optimal.

Sensor circuit 10 will be described in more detail with reference to FIGS. 2, 3A, 3B, 4A, and 4B.

Sensor Circuit 20 (FIG. 1B)

FIG. 1B shows sensor circuit 20, which includes single plate terminal displacement capacitance sensor 22 and C/D sigma delta modulator 24. Capacitance sensor 22 is similar to capacitance sensor 12. Sensor 22 includes sensor capacitor CS and reference capacitor CR, with common plate terminal CP connected to the input of C/D circuit 24. Sensor plate terminal SP receives sensor excitation signal $V_{exc\_sen}$, and reference plate terminal RP receives reference excitation signal $V_{exc\_ref}$. Modulator 24 produces a pulse code modulated output signal PCM, as well as sensor excitation signal $V_{exc\_sen}$ and reference excitation signal $V_{exc\_ref}$.

Sensor circuit 20 offers higher resolution than sensor circuit 10. It addresses the deficiencies in the digitized signal discussed above with respect to sensor circuit 10.

Figure 15:
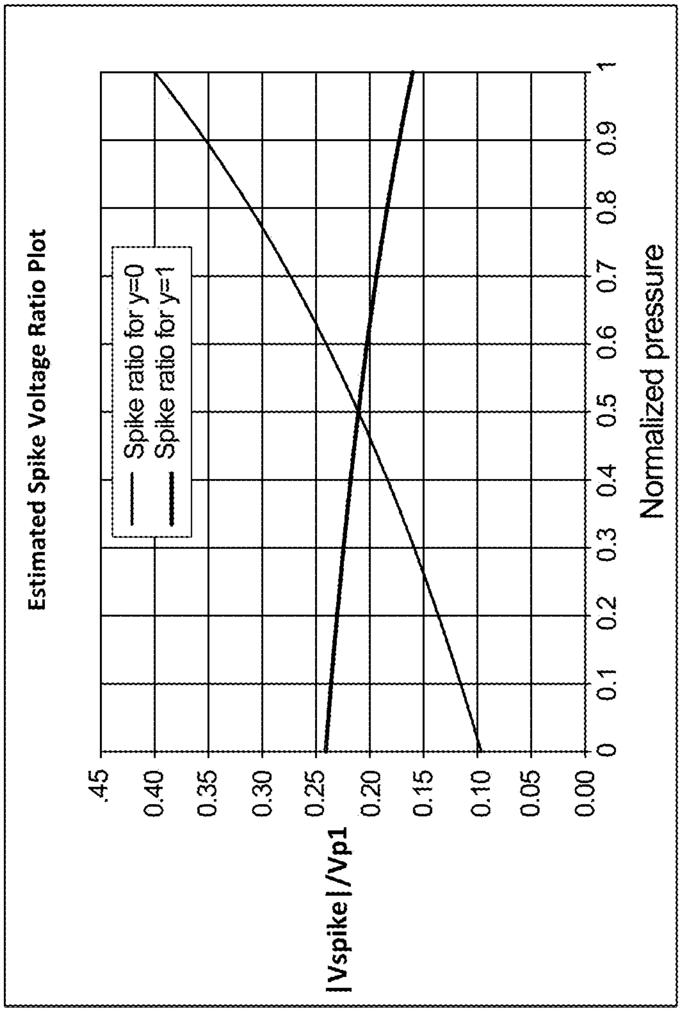
FIG. 15 is a spike voltage ratio plot at the common input pin to the sigma delta modulator of FIG. 12 when output y of the quantizer of the modulator is y=0 and when y=1.
Figure 16:
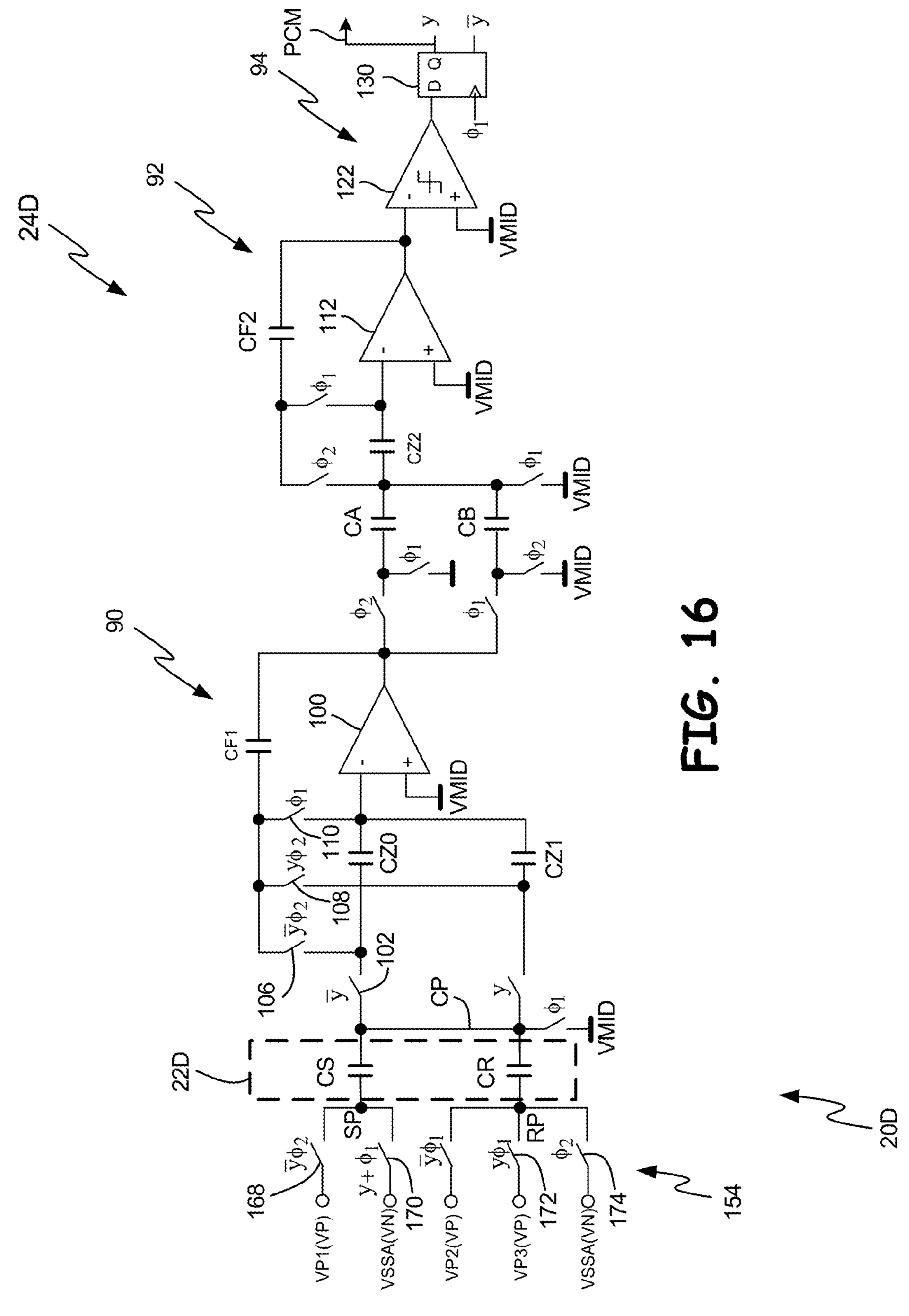
FIG. 16 is a schematic diagram of a second order two-phase sigma delta modulator circuit for measuring/c SA.

Five different embodiments of the sensor circuit 20 illustrated generally in FIG. 1B will be discussed. FIGS. 5-7B describe sensor circuit 20A, which uses a first order two-phase sigma delta modulator. FIGS. 8-11 describe sensor circuit 20B, which uses a second order two-phase sigma delta modulator. FIGS. 12-15 describe sensor circuit 20C, which uses a first order two-phase modulator that includes a programmable ratio-metric excitation voltage generator. FIGS. 16-17C illustrate sensor circuit 20D, which uses a second order two-phase sigma delta modulator with a programmable ratio-metric excitation voltage generator. FIGS. 18-19B show sensor circuit 20E utilizing a second order two-phase sigma delta modulator that includes an adaptive excitation voltage control and a programmable ratio-metric excitation voltage generator.

Capacitance Sensors 12 and 22

Capacitance sensors 12 and 22 are a single plate terminal displacement sensors that can be used, for example, to provide an absolute pressure (AP) measurement. Sensors 12, 22 include sensor capacitor CS (with a capacitance $C_{SENSOR}$) and reference capacitor CR (with capacitance $C_{REF}$). Sensor capacitor CS and reference capacitor CR share common plate terminal CP. Sensor capacitance $C_{SENSOR}$ can be modeled as $$C_{SENSOR} = C_{SA} + C_P = \frac{C_0}{1 - \alpha \cdot \hat{P}_A} + C_P \quad \text{(Eq. 1)}$$

In which $C_{SA}$ is active sensing capacitance, $C_P$ is parasitic capacitance, $\hat{P}_A$ is normalized absolute pressure with dynamic range of [0, 1], and a is normalized elastic constant.

Example normalized capacitance parameters of sensors 12, 22 with α=0.6 is listed in Table 1, and with the capacitances normalized to $C_0$, where $C_0$ is active sensing capacitance at $\hat{P}_A=0$, and $C_1$ is active sensing capacitance at $\hat{P}_A=1$.

TABLE 1

Example parameters of an existing sensor with α = 0.6

| Capacitance parameters | | Normalized |
|---|---|---|
| Active sensing capacitance at $\hat{P}_A = 0$ | $\hat{C}_0$ | 1.000 |
| Active sensing capacitance at $\hat{P}_A = 1$ | $\hat{C}_1$ | 2.500 |
| Parallel parasitic capacitance | $\hat{C}_P$ | 0.536 |

Eq. 1 can be rewritten as:

$$\hat{C}_{SENSOR} = \hat{C}_{SA} + \hat{C}_P = \frac{1}{1 - \alpha * \hat{P}_A} + \hat{C}_P \quad \text{(Eq. 1 rewritten)}$$

Sensor Circuit 10 (FIGS. 1A and 2-4B)

Figure 2:
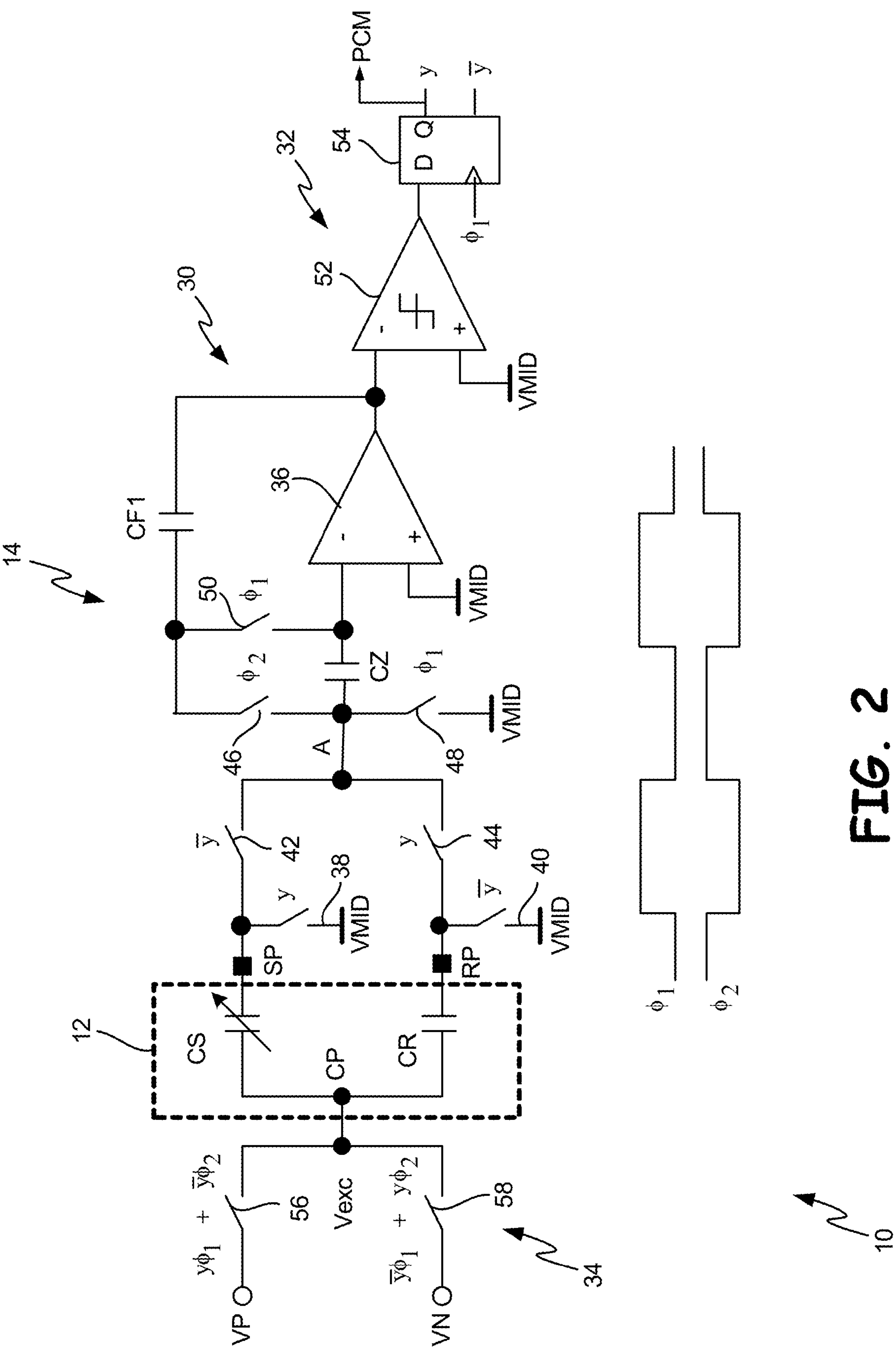
FIG. 2 is a schematic diagram of a sensor system using the excitation shown in FIG. 1A, the system including a terminal displacement capacitance sensor and a first order two-phase sigma delta modulator, in which a single excitation two-phase signal is supplied to the common plate terminal of the capacitance sensor.

FIG. 2 shows a basic configuration of existing sensor circuit 10. Sensor circuit 10 includes capacitance sensor 12 and C/D sigma delta modulator 14 as discussed in reference to FIG. 1A. Modulator 14 includes integrator 30, quantizer 32, and excitation signal generator 34. Integrator 30 is a first stage integrator, and includes operational amplifier (op amp) 36, switches 38, 40, 42, 44, 46, 48, and 50, auto-zero capacitor CZ and feedback capacitor CF1. Quantizer 32 includes comparator 52 and latch 54. Excitation signal generator 34 includes switches 56 and 58. Also shown in FIG. 2 are clock signals ϕ1 and ϕ2, which produce two-phase operation of modulator 14. Modulator 14 makes use of three voltage levels, VP, VMID, and VN. VMID is a voltage midway between VDDA and VSSA.

In integrator 30, switches 38 and 44 are closed when output y of latch 54 is “1” or high, and switches 40 and 42 are closed when output $\bar{y}$ of latch 54 is “1” or high. Switches 48 and 50 are closed when ϕ1 is high, and switch 46 is closed when ϕ2 is high. Latch 54 of quantizer 32 receives ϕ1 as clock input. Latch 54 is triggered at the front edge of ϕ1.

Excitation signal generator 34 produces excitation signal $V_{exc}$ by alternately applying voltages VP and VN to common plate terminal CP of sensor 12. Switch 56 is closed (supplying VP to terminal CP) when either yϕ1 or $\bar{y}$ϕ2 is high. Switch 58 is closed (supplying VN to terminal CP) when either $\bar{y}$ϕ1 or yϕ2 is high.

In this configuration, common plate terminal CP of sensing capacitor CS and reference capacitor CR is connected to the excitation signal $V_{exc}$ generated by excitation signal generator 34 of modulator 14. The corresponding input terminals connected to sensor capacitor CS and reference capacitor CR are denoted as SP and RP. The charge balancing process in integrator 30 is controlled by output y of the quantizer.

Denote $N_0$ as the number of integrator operations associated with y=0, $N_1$ as the number of integrator operations associated with y=1, and $N=N_0+N_1$, the charge balancing equation can be established as $$N_0 \cdot \Delta V_{EX} \cdot C_S - N_1 \cdot \Delta V_{EX} \cdot C_{REF} \approx 0 \quad \text{(Eq. 2)}$$

Where $\Delta V_{EX}$ is the magnitude of the sensor excitation signal, $$\Delta V_{EX} = VP - VN \quad \text{(Eq. 3)}$$

VP and VN are DC voltage sources. The charge balancing equation (Eq. 2) leads to the following measurement relation shown in Eq. 4, where η is the output of C/D sigma delta modulator 14. η represents the transfer function (TF) of sensor circuit 10. It is a function of capacitors CS and CR and provides an approximate estimate of the state of sensor 12. It is defined as $\eta=(N_1-N_0)/N$, in terms of the PCM signal. All expressions of η relating to sensor capacitors are approximations. Equation 4 is a good approximation if N is large.

$$\eta \equiv \frac{N_1 - N_0}{N} \approx \frac{C_{SENSOR} - C_{REF}}{C_{SENSOR} + C_{REF}} = 1 - 2 \cdot \frac{C_{REF}}{C_{SENSOR} + C_{REF}} \quad \text{(Eq. 4)}$$

(1) Transfer Function Linearity

By substitute expression (Eq. 1) into (Eq. 4), it leads to following transfer function (TF):

$$\eta \approx 1 - 2 \cdot \frac{\hat{C}_{REF}}{\frac{1}{1 - \alpha \cdot \hat{P}_A} + \hat{C}_P + \hat{C}_{REF}} \quad \text{(Eq. 5)}$$

It is a non-linear function of normalized pressure $\hat{P}_A$.

(2) Transfer Function Dynamic Range

For the case α=0.6 and $\hat{C}_P=0$, by choosing the normalized reference capacitor as $\hat{C}_{REF}=1.581$, the transfer function dynamic range is maximized and centralized. The dynamic range is [−0.2252, 0.2252]. The corresponding TF plot is shown as a thinner line in FIG. 3A. For the case of α=0.6 and $\hat{C}_P=0.5$, by choosing the normalized reference capacitor as $\hat{C}_{REF}=2.121$, the transfer function dynamic range is maximized and centralized. The dynamic range is [−0.1716, 0.1716]. The corresponding TF plot is shown as a thicker line in FIG. 3A. When the normalized parasitic capacitance $\hat{C}_P$ equals or exceeds 0.5, the transfer function dynamic range becomes much narrower.

(3) Transfer Function Sensitivity

Transfer function sensitivity is defined as $$\kappa \equiv \partial\eta / \partial\hat{P}_A \quad \text{(Eq. 6)}$$

Figure 3B:
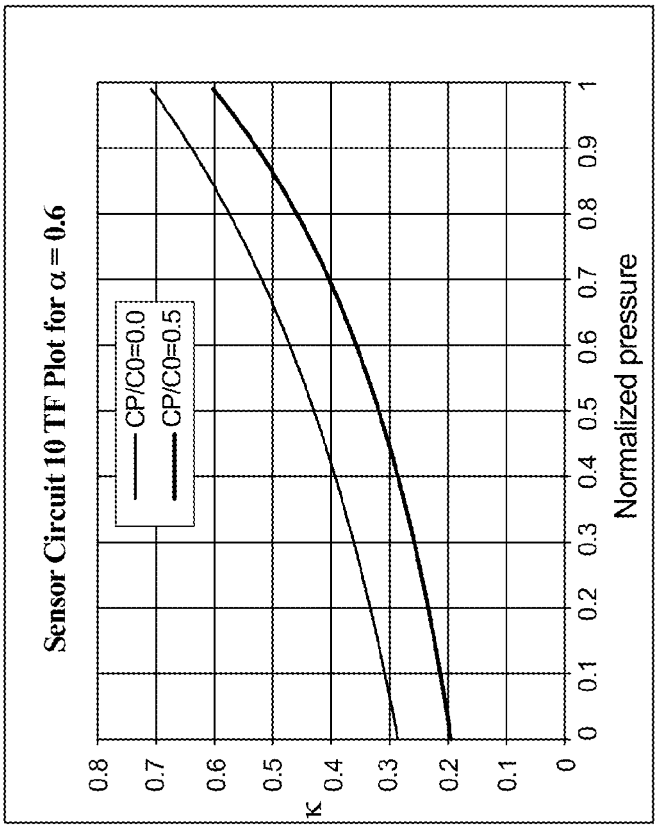
FIGS. 3A and 3B show transfer function dynamic range and transfer function sensitivity for two different values of normalized parasitic capacitance in the capacitance sensor of FIG. 2.
Figure 3A:
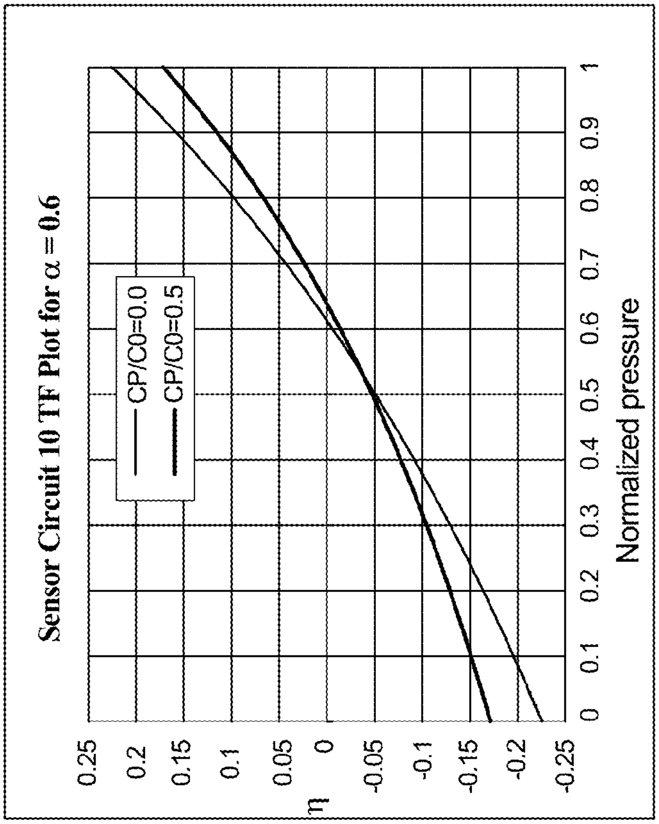
Figure 4B:
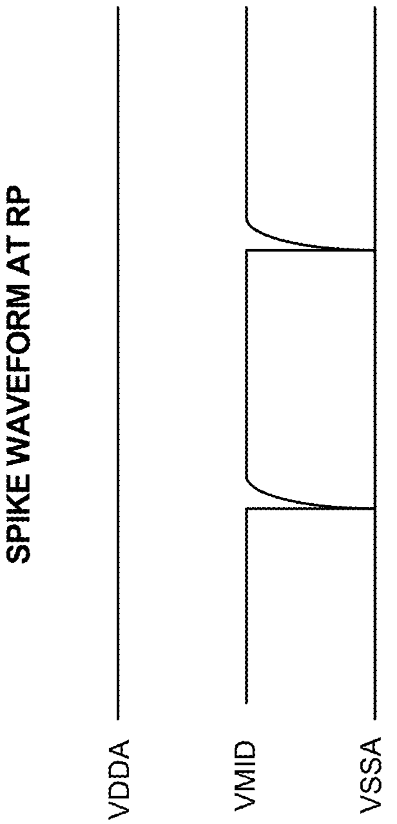
FIGS. 4A and 4B show spike voltage waveforms at the sensor and reference input pins of the sigma delta modulator shown in FIG. 2.
Figure 4A:
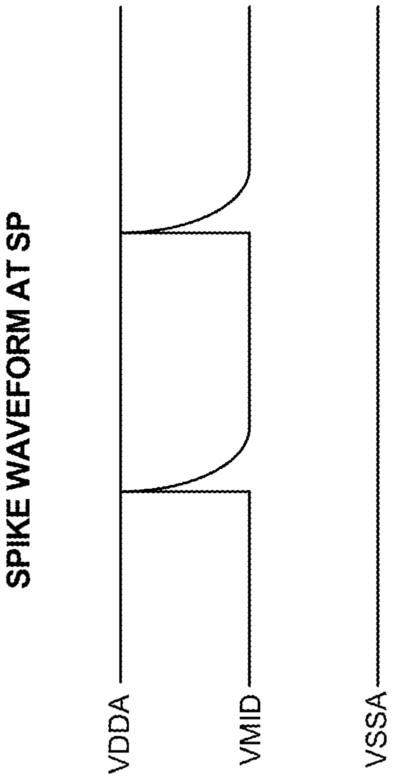

FIG. 3B shows the sensitivity plots for sensor circuit 10 with α=0.6. The thinner line is for $\hat{C}_P=0$. The sensitivity variation range is [0.286, 0.708]. The thicker line is for $\hat{C}_P=0.5$, the sensitivity variation range is [0.195, 0.602]. When normalized parasitic capacitance $\hat{C}_P$ equals or exceeds 0.5, the transfer function sensitivity becomes much lower.

(4) Excitation Level

In sensor circuit 10, the excitation magnitude is designed as 0.5*VDDA. The spike voltage waveforms at input pin SP and RP are shown as FIGS. 4A and 4B, in which where VDDA is analog supply voltage, VSSA=0 volts is analog ground, VMID=VDDA/2 is reference voltage. In order to improve signal to noise ratio (S/N), a typical approach is to increase sensor excitation magnitude. Unfortunately, for sensor circuit 10, the room for increasing excitation magnitude is limited. This is because if the spike voltages at terminals SP and RP exceed beyond the supply voltage rails (VDDA and VSSA), the spike voltages may introduce leakage effect and, as a result, the measurement accuracy will be degraded.

Sensor Circuit 20A (FIGS. 5-7C)

Figure 5:
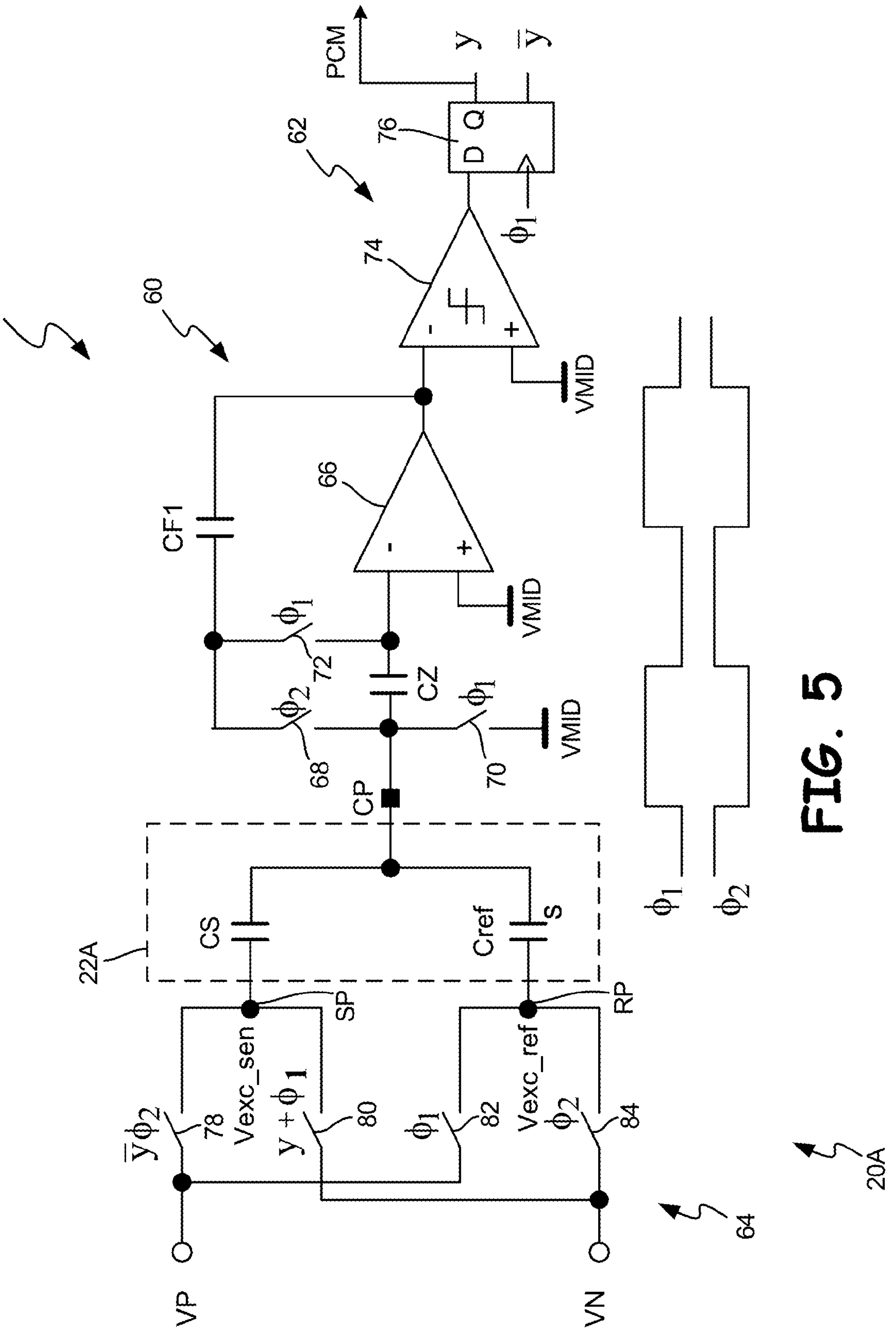
FIG. 5 is a schematic diagram of a first order two-phase sigma delta modulator circuit using the excitation shown in FIG. 1B for measuring $\hat{C}_{REF}/\hat{C}_{SENSQR}$, where $\hat{C}_{REF}$ is normalized reference capacitance and $\hat{C}_{SENSOR}$ is normalized sensor capacitance.

FIG. 5 shows the basic configuration of the proposed sensor circuit. FIG. 5 shows sensor circuit 20A, which is a basic configuration of sensor circuit 20 shown in FIG. 1B. Sensor circuit 20A includes capacitance sensor 22A and first order C/D sigma delta modulator 24A.

Modulator 24A includes integrator 60, quantizer 62, and excitation signal generator 64. Integrator 60 is a first stage integrator, and includes op amp 66, switches 68, 70, and 72, auto zero capacitor CZ, and feedback capacitor CF1. Quantizer 62 includes comparator 74 and latch 76. Excitation signal generator 64 includes switches 78, 80, 82, and 84. Also shown in FIG. 5 are clock signals ϕ1 and ϕ2.

In integrator 60, switches 70 and 72 are closed when ϕ1 is high, and switch 68 is closed when ϕ2 is high. ϕ1 provides the clock input to latch 76 of quantizer 62.

Excitation signal generator 64 provides excitation signal Vexc_sen to the SP terminal of capacitance sensor 22A and provides excitation signal Vexc_ref to terminal RP of sensor 22A. Switch 78 is closed when $\bar{y}$ and ϕ2 are both high. Switch 80 is closed when either y or ϕ1 is high. Switch 82 is closed when ϕ1 is high, and switch 84 is closed when ϕ2 is high.

In this circuit configuration, the sensor capacitor CS and reference capacitor CR of capacitance sensor 22A are formed as a capacitive bridge. Common plate terminal CP of the bridge is connected to the input of integrator 60. Modulator 24A generates two excitation signals, Vexc_sen and Vexc_ref. Signal Vexc_sen serves for sensor capacitor CS excitation. Signal Vexc_ref serves for reference capacitor CR excitation.

Based on switch control logic as marked in FIG. 5, the excitation voltages can be expressed as:

$$\Delta V_{exc\_sen} = \begin{cases} \Delta V_{EX} & \text{for } y = 0 \\ 0 & \text{for } y = 1 \end{cases} \quad \text{(Eq. 7)}$$

$$\Delta V_{exc\_ref} = -\Delta V_{EX} \quad \text{(Eq. 8)}$$

In which $$\Delta V_{EX} = V_P - V_N \quad \text{(Eq. 9)}$$

As a result, the net charge transferring from the sensor bridge to the input node of the integrator is $$\Delta Q = \begin{cases} \Delta V_{EX} \cdot (C_{SENSOR} - C_{REF}) & \text{for } y = 0 \\ -\Delta V_{EX} \cdot C_{REF} & \text{for } y = 1 \end{cases} \quad \text{(Eq. 10)}$$

Denote $N_0$ as the number of integrator operations of y=0, $N_1$ as the number of integrator operations of y=1, the charge balancing equation is established as $$N_0\cdot\Delta V_{EX}\cdot(C_{SENSOR}-C_{REF})-N_1\cdot V_{EX}\cdot C_{REF}\approx 0 \quad \text{(Eq. 11)}$$

Notice that $N=N_0+N_1$, it can be simplified as $$N_0\cdot\Delta V_{EX}\cdot C_{SENSOR}-N\cdot V_{EX}\cdot C_{REF}\approx 0 \quad \text{(Eq. 12)}$$

This equation leads to following measurement relation.

$$\eta \equiv \frac{N_1-N_0}{N} \approx 1-2\cdot\frac{C_{REF}}{C_{SENSOR}} \quad \text{(Eq. 13)}$$

We see that it is a linear function of $C_{REF}/C_{SENSOR}$. Therefore, the proposed sensor circuit 20A is suitable for the measuring the capacitance ratio of reference capacitor CR to sensor capacitor CS.

Comparison of Sensor Circuit 20A with Sensor Circuit 10

Comparisons are made between sensor circuit 20A and sensor circuit 10 in two cases: Case 1: α=0.6, $\hat{C}_P=0$; Case 2: α=0.6, $\hat{C}_P=0.5$.

Case 1: α=0.6. $\hat{C}_P=0$ (1) Transfer Function Linearity

In this case, the expression of normalized sensor capacitance (Eq. 1 rewritten) is understood as $$\hat{C}_{SENSOR}=\hat{C}_{SA}=\frac{1}{1-\alpha\cdot\hat{P}_A} \quad \text{(Eq. 14)}$$

The measurement relation (Eq. 13) leads to following transfer function $$\eta\approx(1-2\cdot\hat{C}_{REF})+2\cdot\hat{C}_{REF}\cdot\alpha\cdot\hat{P}_A \quad \text{(Eq. 15)}$$

It is linear function in normalized pressure $\hat{P}_A$.

(2) Transfer Function Dynamic Range

By choosing normalized reference capacitor as $$\hat{C}_{REF}=5/7=0.714 \quad \text{(Eq. 16)}$$

The transfer function of the proposed circuit with centralized dynamic range is $$\eta=-3/7+6/7\cdot\hat{P}_A \quad \text{(Eq. 17)}$$

Figure 6B:
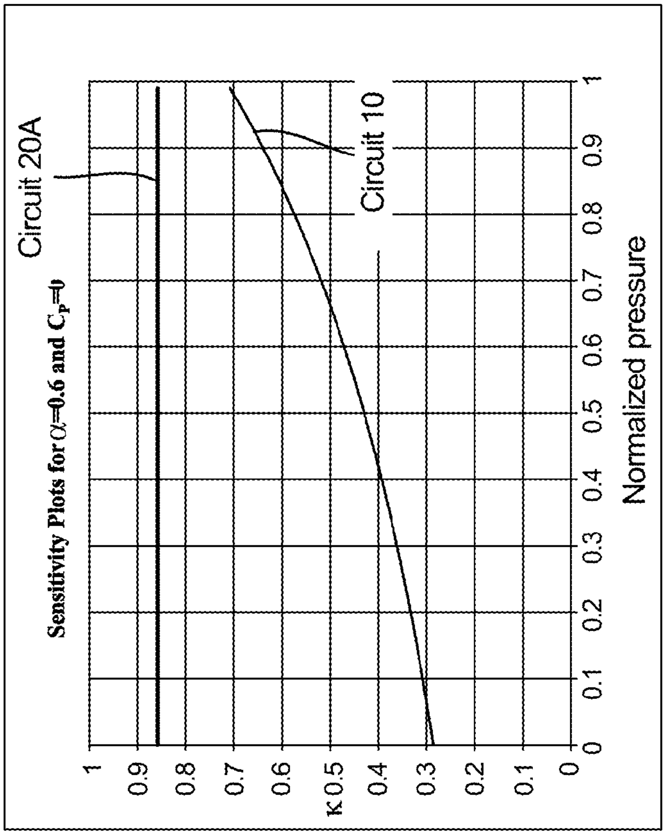
FIGS. 6A and 6B are plots of modulator transfer function and modulator sensitivity, respectively, for the circuits of FIGS. 2 and 5, in which normalized parasitic capacitance equals 0.
Figure 6A:
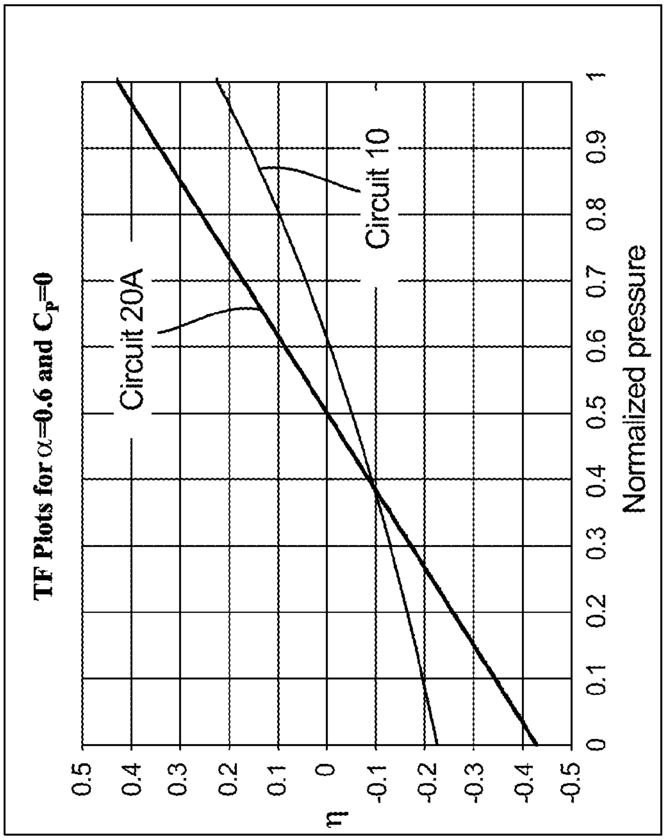

FIG. 6A shows TF plots. TF dynamic range of sensor circuit 20A is [−0.4286, 0.4286], and TF dynamic range of sensor circuit 10 is [−0.2252, 0.2252]. The width of TF dynamic range is increased by a factor of 1.9.

(3) Transfer Function Sensitivity

FIG. 6B shows the sensitivity plots. For sensor circuit 20A, the sensitivity is a constant of 0.8571. For sensor circuit 10, the sensitivity variation range is [0.2858, 0.7079]. Comparing with sensor circuit 10 at zero AP, the sensitivity of sensor circuit 20A is increased by a factor of 3.0.

(4) Maximum Excitation Magnitude

In general, it is desirable to avoid voltage spikes on the bond pads (CP in particular) that go outside the VSSA, VDDA rails. The consequence of excess voltage spikes is charge leakage which upsets the charge balance equations, e.g. Eq. 12. This places a practical limit on the magnitude of the excitation voltage.

In sensor circuit 20A, the largest spike voltage at input pin CP is happened during the operation of y=0, at the same time the normalized pressure reaches to $\hat{P}_A=1.0$. The corresponding spike voltage relative to VMID is estimated as $(5/9)*\Delta V_{EX}$. This means that if excitation magnitude is raised to 0.9*VDDA, the spike voltage approaches to 0.5*VDDA relative to VMID. Therefore, the maximum magnitude of excitation voltage in the proposed circuit can reach to 0.9*VDDA. Comparing with the sensor circuit 10 (0.5*VDDA), the magnitude of excitation signal is increased by a factor of 1.8.

Case 2: α=0.6, $\hat{C}_P=0.5$ (1) Transfer Function Linearity

In this case, the expression of sensor capacitance is understood as expression (Eq. 1). The measurement relation (Eq. 13) leads to following transfer function.

$$\eta \approx 1-2\cdot\frac{\hat{C}_{REF}}{\frac{1}{1-\alpha\cdot\hat{P}_A}\cdot\hat{C}_P} \quad \text{(Eq. 18)}$$

Due to non-zero parasitic capacitance, the transfer function is no longer a linear function of normalized pressure $\hat{P}_A$.

Choosing normalized reference capacitor as $$\hat{C}_{REF}=1.0 \quad \text{(Eq. 19)}$$

The dynamic range of the transfer function is centralized, and the corresponding transfer function can be written as $$\eta \approx -3+\frac{4}{1.5-0.3\cdot\hat{P}_A} \quad \text{(Eq. 20)}$$

Figure 7B:
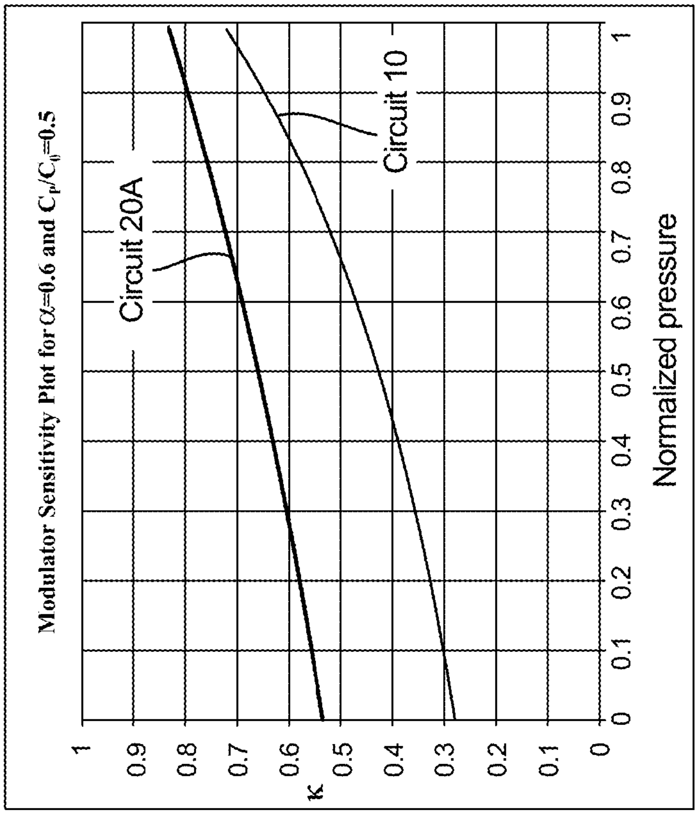
FIGS. 7A and 7B are plots of modulator transfer function and modulator sensitivity, respectively, for the circuits of FIGS. 2 and 5 in which normalized parasitic capacitance equals 0.5.
Figure 7A:
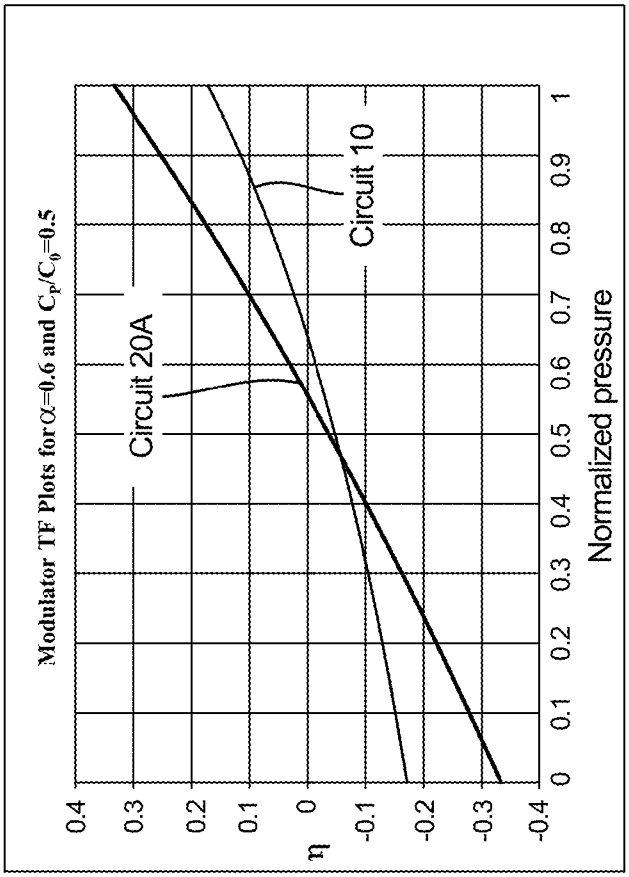

FIG. 7A shows the transfer function plots. The TF linearity of sensor circuit 20A is greatly improved in comparison with sensor circuit 10.

(2) Transfer Function Dynamic Range

FIG. 7A shows that sensor circuit has 20A TF dynamic range of [−0.3333, 0.3333]. Comparing with TF dynamic range of circuit 10 [−0.1716, 0.1716], the width of TF dynamic range is increased by a factor of 1.94.

(3) Transfer Function Sensitivity

FIG. 7B shows the sensitivity plots. In the sensitivity plot of sensor circuit 20A, the sensitivity is no longer a constant, and the variation range is [0.5343, 0.8313]. In the sensitivity plot of sensor circuit 10, the sensitivity range is [0.2858, 0.7079]. Comparing with sensor circuit 10 at zero absolute pressure, the sensitivity of sensor circuit 20A is increased by a factor of 1.87.

(4) Excitation Voltage Level

In sensor circuit 20A, the largest spike voltage at input terminal CP is happened during the operation of y=0, at the same time the normalized pressure is reaches to $\hat{P}_A=1.0$. The corresponding spike voltage relate to VMID is estimated as $(1/2)*\Delta V_{EX}$. This means that if the excitation magnitude is raised to 1.0*VDDA, the spike voltage at input terminal CP approaches to 0.5*VDDA relative to VMID. Therefore, the maximum magnitude of excitation signal can reach to 1.0*VDDA. Comparing with sensor circuit 10 (0.5*VDDA), the magnitude of excitation signal is increased by a factor of 2.0.

Sensor Circuit 20B (FIGS. 8-11)

Figure 8:
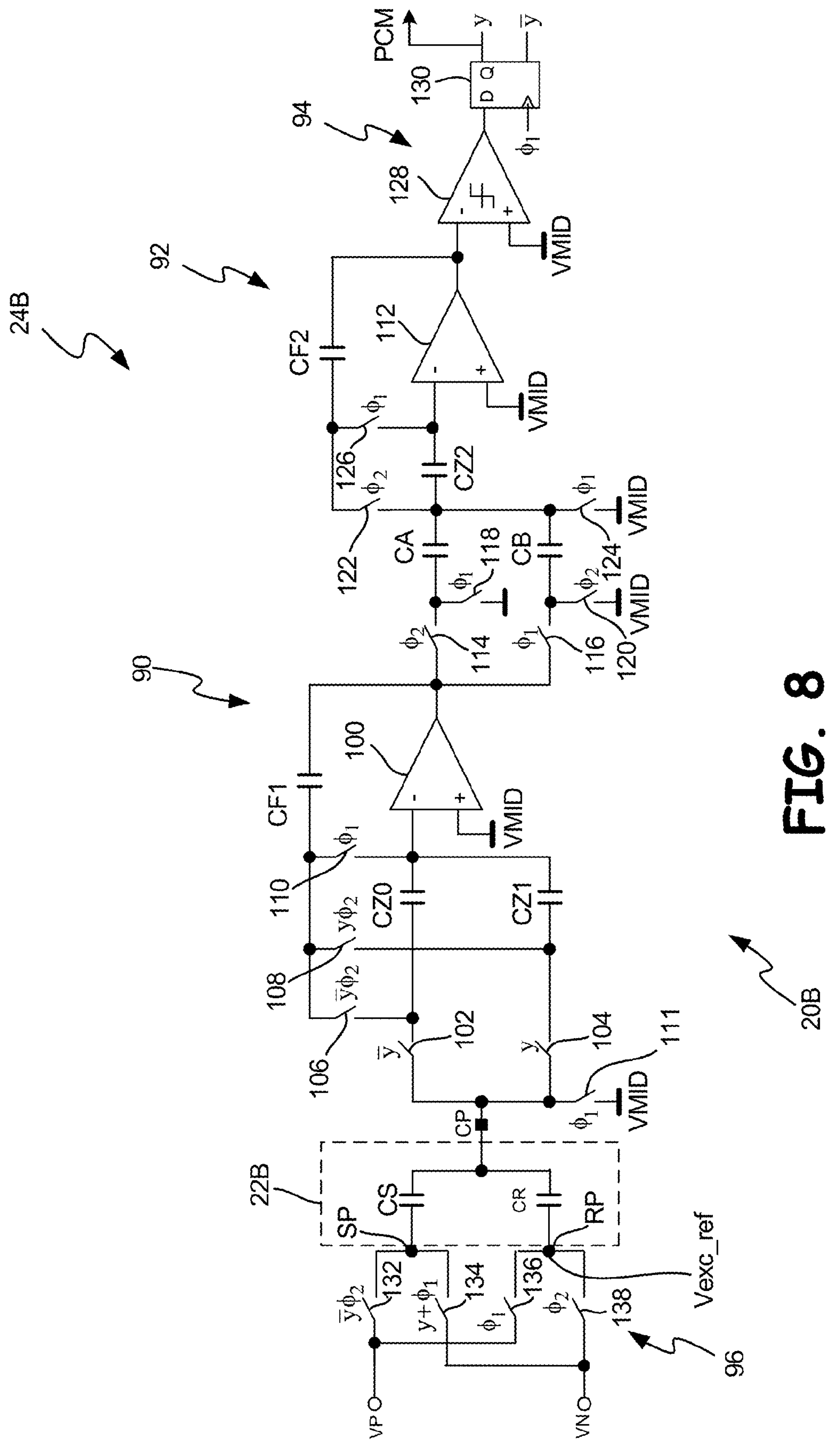
FIG. 8 is a schematic diagram showing a second order two-phase modulator circuit for measuring capacitance ratio $\hat{C}_{REF}/\hat{C}_{SENSOR}$.

FIG. 8 shows sensor circuit 20B, which features second order sigma-delta modulator for measuring capacitance ratio $C_{REF}/C_{SENSOR}$. Sensor circuit 20B has the same transfer function (TF) as sensor circuit 20A. FIGS. 6 and 7 are applicable to sensor circuit 20B as well as sensor circuit 20A.

In sensor circuit 20B, some improvements have been made based on sensor circuit 20A shown as FIG. 5. First, a second stage integrator is added in order to suppress quantization noise. Second, two auto-zero capacitors, CZ0 and CZ1, are arranged in the CDS circuit (correlated double sampling circuit) in the first stage integrator, where CZ0 serves as auto-zero capacitor for integration of y=0, CZ1 serves as auto-zero capacitor in integration of y=1. The CDS circuit in the first stage integrator not only provides the suppression of amplifier offset, 1/f noise, it also provides better compensation for amplifier finite gain error.

Sensor circuit 20B includes capacitance sensor 22B and C/D sigma delta modulator 24B. Sensor 22B is similar to capacitance sensors 22 and 22A shown in FIGS. 1B and 5, respectively. It includes sensor capacitor CS, reference sensor CR, and terminals CP, SP, and RP.

Modulator 24B includes first stage integrator 90, second stage integrator 92, quantizer 94, and excitation signal generator 96. First stage integrator 90 receives input from terminal CP of sensor 22B. First stage integrator 90 includes op amp 100, switches 102, 104, 106, 108, 110 and 111, auto zero capacitors CZ0 and CZ1, and feedback capacitor CF1.

The input of second stage integrator 92 is connected to the output of op amp 100 of first stage integrator 90. Second stage integrator 92 includes op amp 112, switches 114, 116, 118, 120, 122, 124, and 126, capacitor CA and CB, auto zero capacitor CZ2, and feedback capacitor CF2.

The output of second stage integrator 92 is connected to the input of quantizer 94, which includes comparator 128 and latch 130. The φ1 clock signal is a clock input to latch 130. The outputs of latch 130 are y and $\bar{y}$. The y output also is used as the pulse code modulated PCM output of modulator 24B.

Excitation signal generator 96 is similar to excitation signal generator 64 shown in FIG. 5. Excitation signal generator 96 alternately applies voltages VP and VN to the SP and RP inputs of capacitance sensor 22B. Excitation signal generator 96 includes switches 132, 134, 136, and 138.

Modulator 24B uses clock signals φ1 and φ2 to provide two-phase operation. Waveforms of clock signals φ1 and φ2 are not shown in FIG. 8, but are the same as those shown in FIG. 5.

Simulations have been made in transistor level on the circuit shown as FIG. 8. In the simulations, the supply voltage is VDDA=2.4V, Reference voltage VMID=1.2V. Excitation voltage sources selected are VP=2.4V, VN=0V. The sensor device parameters are assumed as $\hat{C}_0=\hat{C}_{REF}=1$, $\hat{C}_P=0.5$, and α=0.6. The simulation results for normalized absolute pressure $\hat{P}_A$=0, 5/9, 1.0 are reported here. The corresponding values of normalized active sensing capacitance, normalized parasitic capacitance and normalized reference capacitance are as listed in Table 2. The expected transfer function (TF) value is η computed using Eq. 20.

TABLE 2

Input capacitance in the simulations

| $\hat{P}_A$ | $\hat{C}_{SA}$ | $\hat{C}_P$ | $\hat{C}_{REF}$ | Expected TF value |
|---|---|---|---|---|
| 0 | 1.000 | 0.500 | 1.000 | −1/3 |
| 5/9 | 1.500 | 0.500 | 1.000 | 0 |
| 1.0 | 2.500 | 0.500 | 1.000 | +1/3 |

Figure 9A:
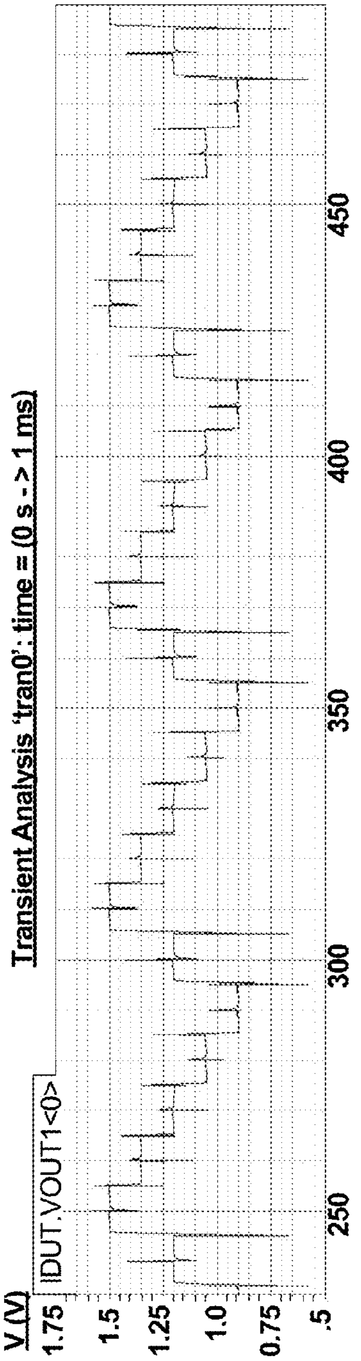
FIGS. 9A-9C show waveforms at the output of the first stage integrator of the circuit of FIG. 8 at three different normalized absolute pressure values.
Figure 9B:
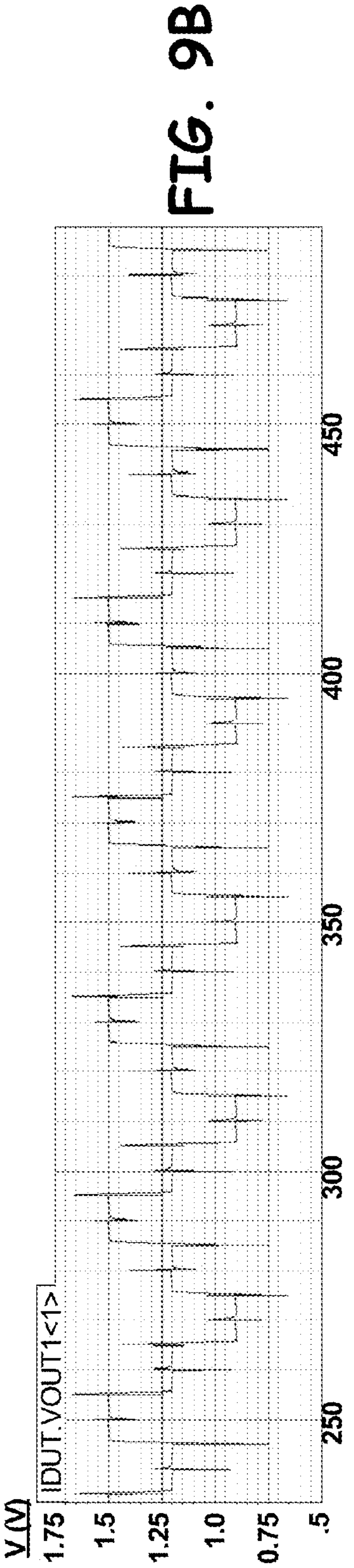
Figure 9C:
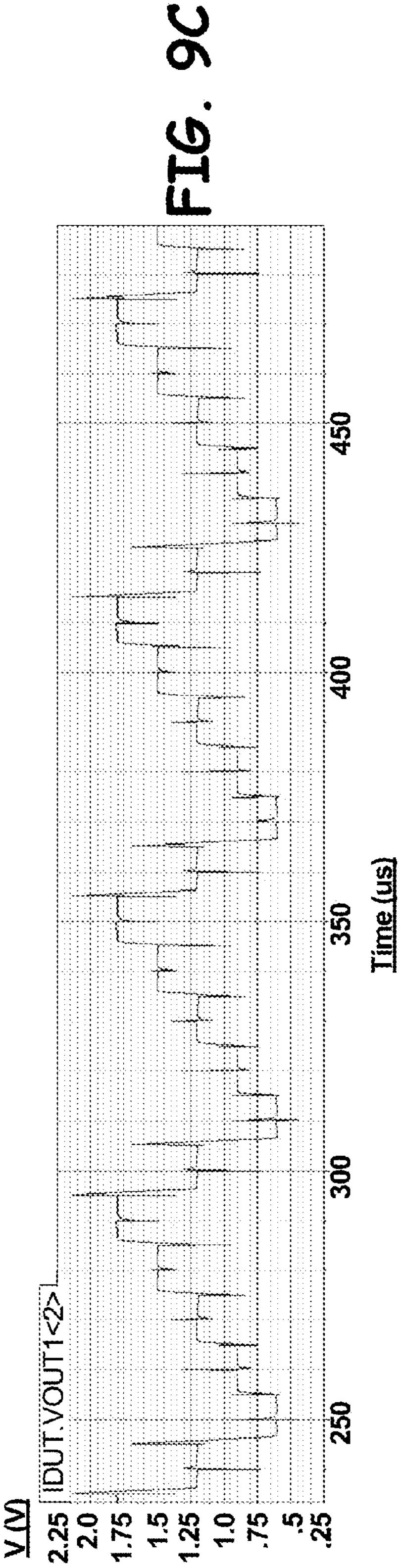

Waveforms at the output of first stage integrator are shown as FIGS. 9A-9C. Notice that, the integrators 90, 92 shown in FIG. 8 are of inverted type. It means that the transfer of positive (negative) charge from the sensor bridge (capacitance sensor 22B) to the input node of integrator 90 will induce a negative (positive) voltage step at the output of integrator 90.

Case $\hat{P}_A$=0

The waveform is shown in FIG. 9A, where four integrator operations of y=0 (down-step) are balanced by two integrator operations of y=1 (up-step). In other words, from the waveform over a period of six integrations, four are positive and two are negative; then the cycle repeats. $N_0$=2, $N_1$=4, and N=6. This means $\eta=(N_0-N_1)/N=(2-4)/6=-1/3$.

Case $\hat{P}_A$=5/9

The waveform is shown in FIG. 9B, where two integrator operations of y=0 (down-step) are balanced by two integrator operations of y=1 (up-step). This means η=0.

Case $\hat{P}_A$=1.0

The waveform is shown in FIG. 9C, where two integrator operations of y=0 (down-step) are balanced by four integrator operations of y=1 (up-step). This means η=1/3.

Spike Waveform Examination

Figure 10A:
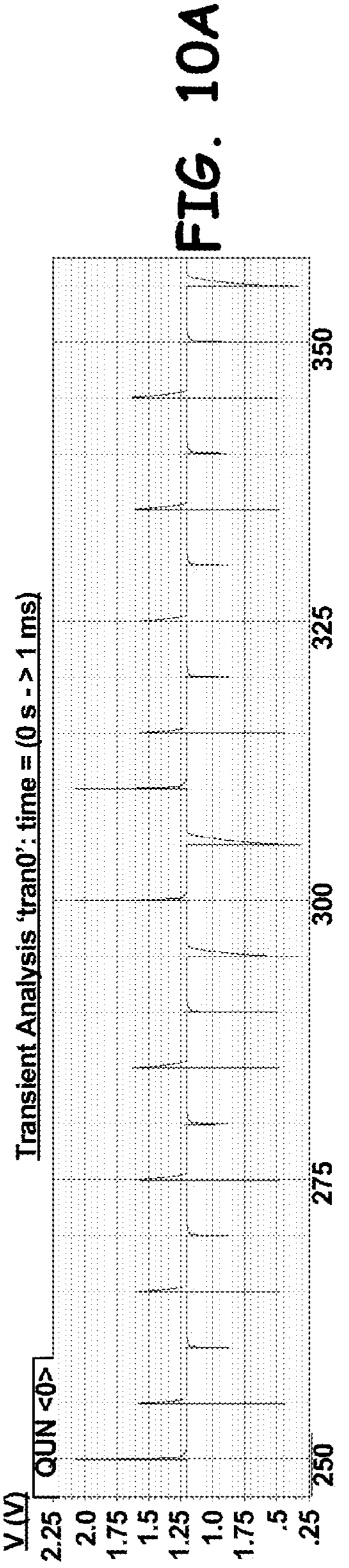
FIGS. 10A-10C show spike waveforms at the common input pin to the first stage integrator of the sigma delta modulator of FIG. 8.
Figure 10B:
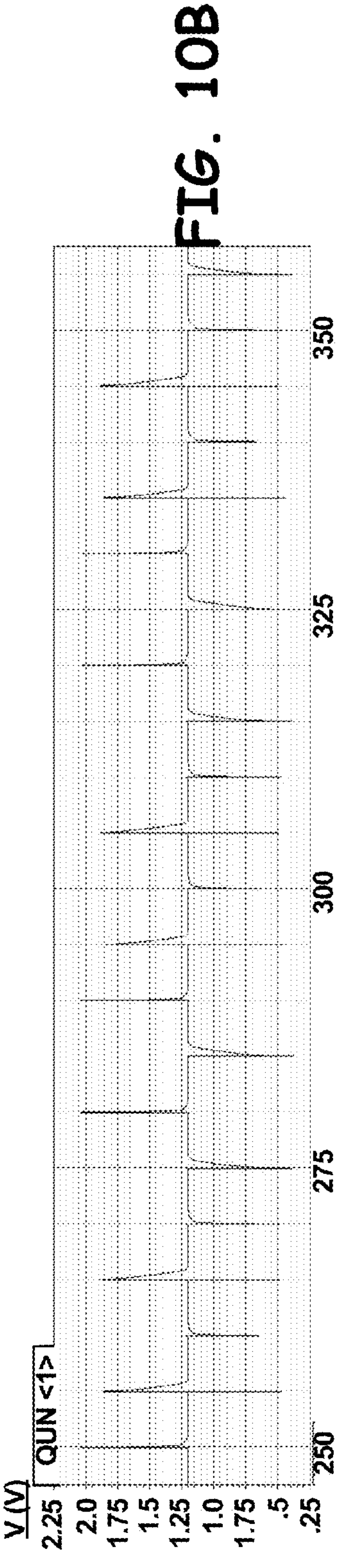
Figure 10C:
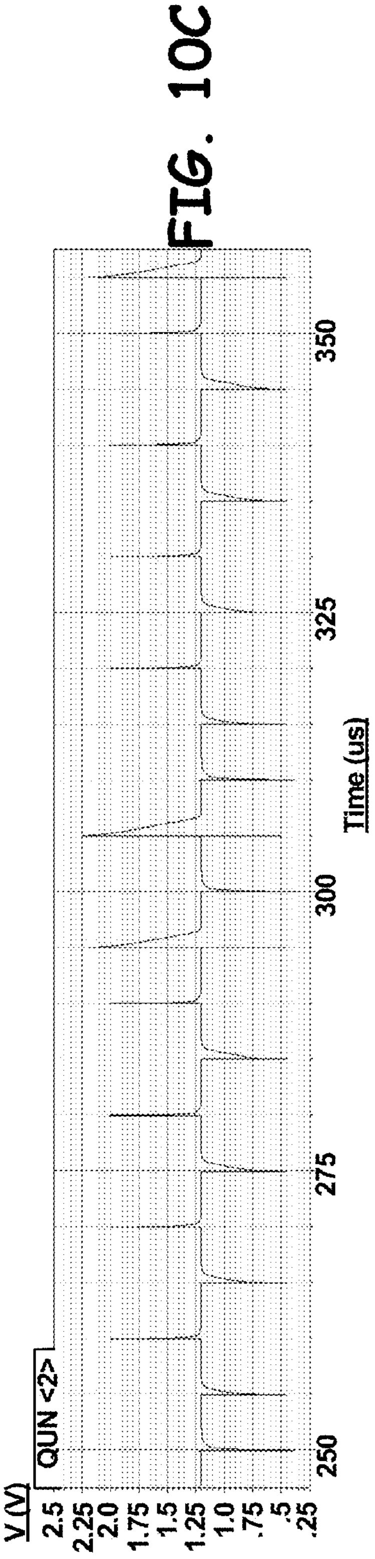
Figure 11:
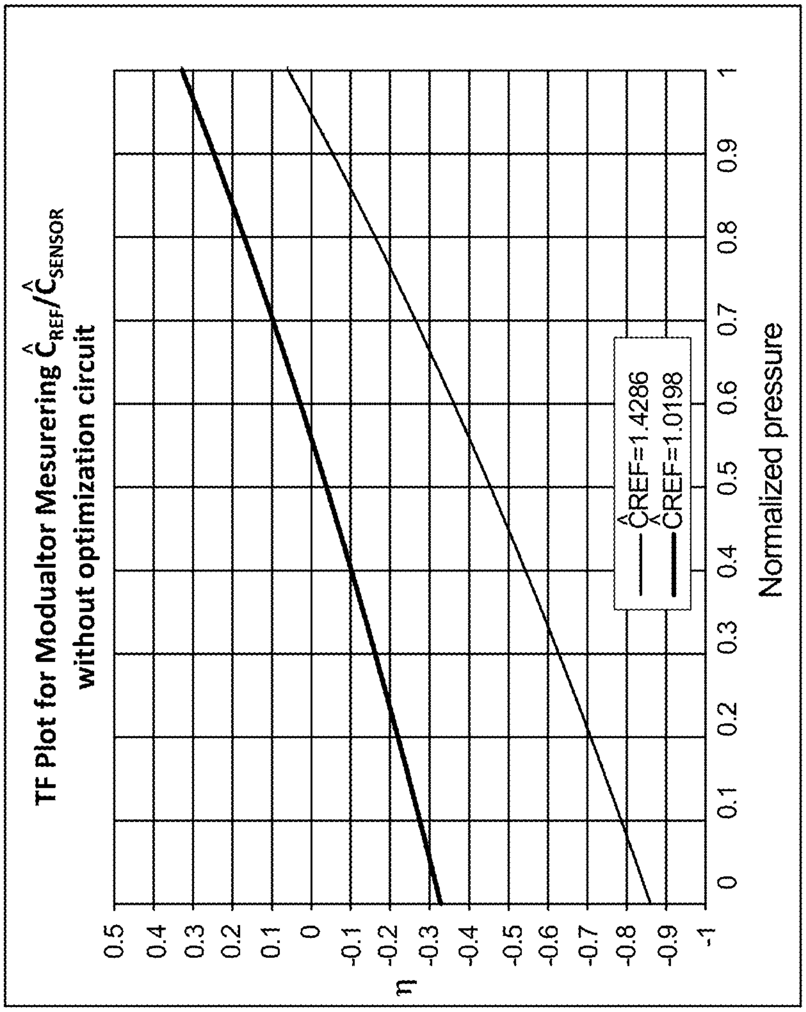
FIG. 11 shows transfer function plots for a sigma delta modulator measuring $\hat{C}_{REF}/\hat{C}_{SENSOR}$ with two different values of $\hat{C}_{REF}$.

FIGS. 10A-10C show the simulated spike waveforms at the input pin CP. The spike voltages relative to VMID are recorded in Table 3. In the simulation the magnitude of the excitation voltages are set as ΔVexc_sen=ΔVexc_ref=VDDA. The simulation shows that the largest spike voltage at input pin CP is happened during the operation of y=0, if the normalized pressure is reaches to $\hat{P}_A$=1.0. The largest spike voltage is 1.05V below half of the VDDA/2=1.2V. The simulation results show that it is feasible for the proposed circuit to raise the excitation level to the same level as VDDA.

TABLE 3

Simulated spike voltage at input pin CP

| $\hat{P}_A$ | Spike Voltage for Case y = 0 | Spike Voltage for Case y = 1 |
|---|---|---|
| 0 | 0.40 V | −0.89 V |
| 5/9 | 0.69 V | −0.82 V |
| 1.0 | 1.05 V | −0.55 V |

In this disclosure, new circuit architectures shown in FIGS. 1B, 5, and 8 are described. Modulators 24A and 24B in these new circuit architecture interface with the common plate CP of the capacitive bridge formed by sensor capacitor CS and reference capacitor CR. The magnitude of the excitation signal can be raised to the same level as VDDA and, as a result, the signal to noise ratio is improved. Furthermore, comparing with sensor circuit 10, the modulators 24A, 24B in sensor circuits 20A, 20B are designed for measuring the ratio of reference capacitor to sensor capacitor. As a result, sensor circuits 20A, 20B provide improved transfer function linearity, wider transfer function dynamic range, and higher measurement sensitivity. All these features are crucial for high resolution measurement.

In FIGS. 5 and 8, sigma delta modulators for measuring the capacitance ratio $C_{REF}/C_{SENSOR}$ are described. The measurement relation of the modulator circuit is $$\eta \approx 1 - 2 \cdot \frac{\hat{C}_{REF}}{\hat{C}_{SENSOR}} \quad \text{(Eq. 21)}$$

In which $\hat{C}_{REF}$ is the normalized reference capacitor, and $\hat{C}_{SENSOR}$ is the normalized sensing capacitor. The sensing capacitance includes two parts, active sensing capacitance $C_{SA}$ and parallel parasitic capacitance $C_P$.

$$\hat{C}_{SENSOR}=\hat{C}_{SA}+\hat{C}_P \quad \text{(Eq. 22)}$$

The normalized active sensing capacitance can be modeled as:

$$\hat{C}_{SA}=\frac{1}{1-\alpha\cdot\hat{P}_A} \quad \text{(Eq. 23)}$$

Where $\hat{P}_A$ is the normalized absolute pressure with dynamic range as [0, 1], α is the normalization elastic constant.

Sensor circuits 20A and 20B have advantages in improved transfer (TF) function linearity, wider transfer function (TF) dynamic range, higher measurement sensitivity and higher excitation voltage. All these features are crucial for in high resolution measurement.

Still further improvements are desirable for absolute pressure measurement applications. For the circuits described in FIGS. 5 and 8, it was assumed that the value of the reference capacitor Cref could be specified to a value that causes the transfer function to be centralized. When it is not possible to specify the value of Cref in this manner the enhancements shown in FIGS. 12 and 16 can be used to achieve linearization and centralization.

(1) Parasitic Capacitance Compensation

In the case of non-zero parallel parasitic capacitance, the transfer function is a non-linear function of normalized pressure $\hat{P}_A$. This can be seen by substituting expression (Eq. 23) into measurement relation (Eq. 21); the modulator transfer function becomes $$\eta\approx 1-2\cdot\frac{\hat{C}_{REF}}{\frac{1}{1-\alpha\cdot\hat{P}_A}+\hat{C}_P} \quad \text{(Eq. 24)}$$

The transfer function (Eq. 24) shows that it is a linear function of normalized pressure $\hat{P}_A$ only when $\hat{C}_P=0$. If the normalized parasitic capacitance is larger, the transfer function linearity becomes poorer. As a result the measurement sensitivity is lower.

(2) TF Dynamic Range Centralization

In sensor circuits 20A and 20B, the centralization of the TF dynamic range is achieved based on the assumption that the reference capacitor is selectable. In practical application, the reference capacitor is built in to the capacitance sensor device, and it is not selectable. As a result, the TF dynamic range may not be centralized.

Table 4 is a listing of capacitance parameters for sensor circuit 10 with α=0.6. The normalized reference capacitor listed is $\hat{C}_{REF}$=1.4286. By substituting $\hat{C}_{REF}$=1.4286 into (Eq. 24), the TF dynamic range is no longer centralized. Shown as plot in FIG. 11, the TF plot is shifted to lower side dramatically in comparison with the centralized TF plot. The centralized TF is obtained by selecting the appropriate value for $\hat{C}_{REF}$ (1.01981 for this example). The corresponding TF dynamic range with $\hat{C}_{REF}$=1.4286 becomes [−0.8605, 0.0588] in comparison with centralized dynamic range [−0.3281, 0.3281] for $\hat{C}_{REF}$=1.01981.

Non-centralized TF has some problems. First, if −1.0<η<−0.8 or 1.0>η>0.8, the quantization noise becomes significantly higher. As a result, the measurement resolution is degraded. Second, if η value exceeds the range of [−1, +1], the modulator circuit becomes non-stable thus preventing accurate measurement of pressure.

Therefore, further improvements to sensor circuits 20A and 20B are desired. A further improved sensor circuit must have the following functions:

(a) Parallel parasitic capacitance compensation for the sensing capacitance of the capacitance sensor.

(b) Transfer function dynamic range centralization based on a non-selectable built-in reference capacitor.

In the following, sensor circuits 20C, 20D, and 20E based on circuits 20A and 20B of FIGS. 5 and 8 are described. In addition to modulator transfer function optimization, additional methods for the improvement of S/N ratio (signal-to-noise ratio) are also described.

TABLE 4

Example parameters of an existing sensor circuit 10 with α = 0.6

| Capacitance parameters | | Normalized |
|---|---|---|
| Active sensing capacitance at $\hat{P}_A$ = 0 | $\hat{C}_0$ | 1.0000 |
| Active sensing capacitance at $\hat{P}_A$ = 1 | $\hat{C}_1$ | 2.5000 |
| Parallel parasitic capacitance | $\hat{C}_P$ | 0.5357 |
| Reference capacitor | $\hat{C}_{REF}$ | 1.4286 |

Measurement Relation for Improved Modulator

The measurement relation of an improved modulator is specified as $$\eta\approx 1-2\cdot\frac{\hat{C}_C}{\hat{C}_{SA}} \quad \text{(Eq. 25)}$$

Comparing with measurement relation (Eq. 21), $\hat{C}_{SENSOR}$ in the denominator of the second term is replaced by $\hat{C}_{SA}$. This is required due to the function of parallel parasitic capacitance compensation. Furthermore, $C_{REF}$ in the numerator of second term is replaced by $C_C$, which is also required due to TF dynamic range centralization. Here the characteristic capacitance $C_C$ is defined as $$C_C\equiv\frac{C_1\cdot C_0}{C_1+C_0}=\frac{C_0}{2-\alpha} \quad \text{(Eq. 26)}$$

The centralized η dynamic range is $$\eta\in\left[-\frac{C_1-C_0}{C_0+C_1},\ \frac{C_1-C_0}{C_0+C_1}\right] \quad \text{(Eq. 27)}$$

Here $C_0$ is active sensing capacitance $C_{SA}$ at $\hat{P}_A$=0, and $C_1$ is active sensing capacitance $C_{SA}$ at $\hat{P}_A$=1.

Same as other normalized capacitance parameters, we define the normalized characteristic capacitance as $$\hat{C}_C\equiv\frac{C_C}{C_0}=\frac{1}{2-\alpha} \quad \text{(Eq. 28)}$$

For a capacitance sensor device with α=0.6, the value of normalized characteristic capacitance is $\hat{C}_C=5$.

Basic Circuit Implementation Sensor Circuit 20C (FIGS. 12-15)

Sensor circuit 20C includes capacitance sensor 22C and C/D sigma delta modulator 24C. Modulator 24C is generally similar to modulator 24A of sensor circuit 20A shown in FIG. 5, except that modulator 24C features programmable ratio-metric voltages used to produce excitation signals Vexc_sen and Vexc_ref.

Modulator 24C includes integrator 150, quantizer 152, and excitation signal generator 154. Integrator 150 includes op amp 156, switches 158, 160, and 162, auto-zero capacitor CZ, and feedback capacitor CF1. The output of op amp 156 is provided to the input of quantizer 152, which includes comparator 164 and latch 166.

Excitation signal generator 154 makes use of four different voltage levels to provide excitation to capacitance sensor 22C. Those four voltage levels are VP1, VP2, VP3, and VSSA. Excitation signal generator includes switches 168, 170, 172, 174, and 176. Switch 168 connects VP1 to terminal SP when $\bar{y}$ and ϕ2 are both high. Switch 170 connects VSSA to terminal SP when either y or ϕ1 is high. Thus, excitation signal Vexc_sen has two possible levels: VP1 and VSSA.

Excitation Vexc_ref has three possible levels. Voltage VP2 is connected to terminal RP by switch 172 when $\bar{y}$ and ϕ1 are both high. Voltage VP3 is connected to terminal RP by switch 174 when y and ϕ1 are both high. Voltage VSSA is connected to terminal RP by switch 176 when clock signal ϕ2 is high.

Ratio-Metric Excitation Voltage Sources

Figure 13:
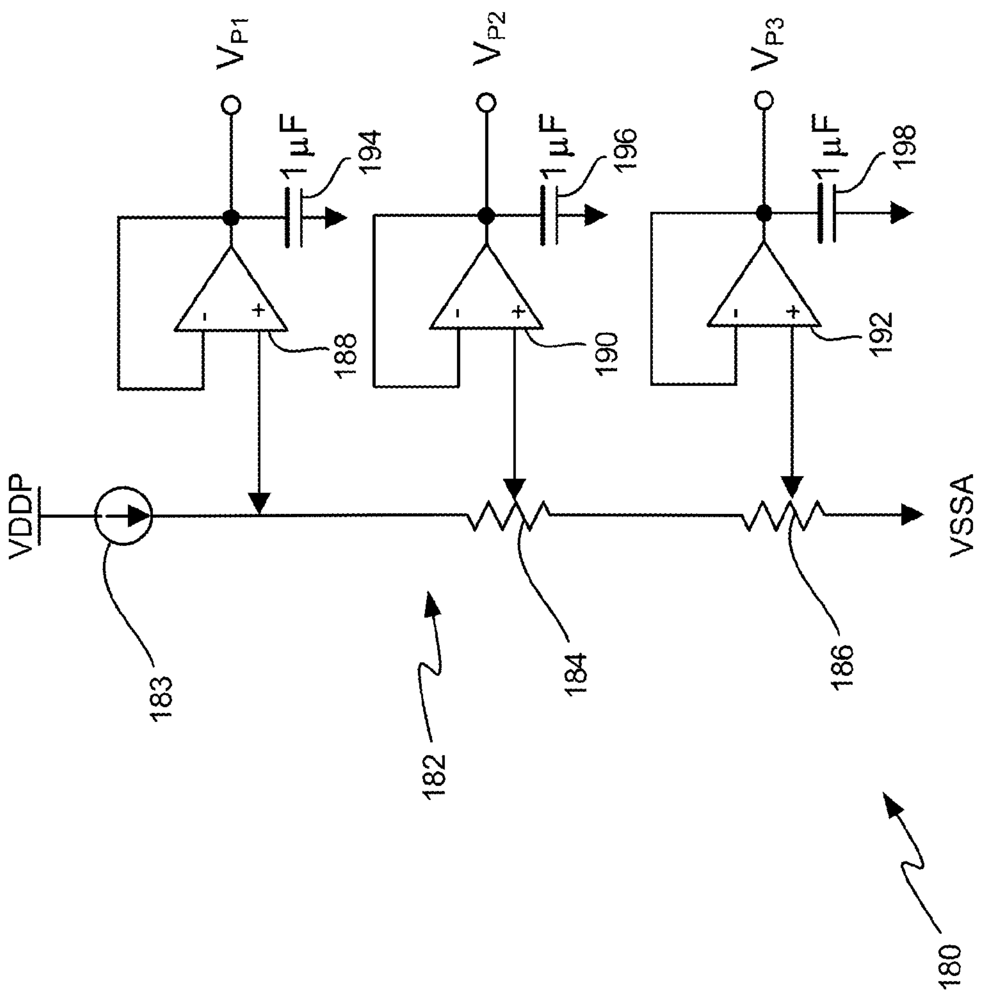
FIG. 13 is a schematic diagram of a programmable ratio-metric excitation voltage generator for use in conjunction with the modulator circuit of FIG. 12.

Modulator 24C also includes programmable ratio-metric excitation voltage generator 180 shown in FIG. 13. Voltage generator 180 is connected to excitation signal generator 154, and provides voltage levels VP1, VP2, VP3, and VSSA. Voltage generator 180 includes voltage divider 182 connected between supply rails VDDP and VSSA. Voltage divider 182 includes current source 183, potentiometers 184 and 186. Op amps 188, 190, and 192 and capacitors 194, 196, and 198 derive voltages VP1, VP2, and VP3 from voltage divider 182. VDDP is a voltage rail that in practice is at a higher voltage than VP1, and can be even higher than VDDA, if necessary. The inclusion of current source 183 is optional. Other options include a direct connection of the divider to VDDA or other source voltage, or replacement of current source 183 with another resistor.

Figure 12:
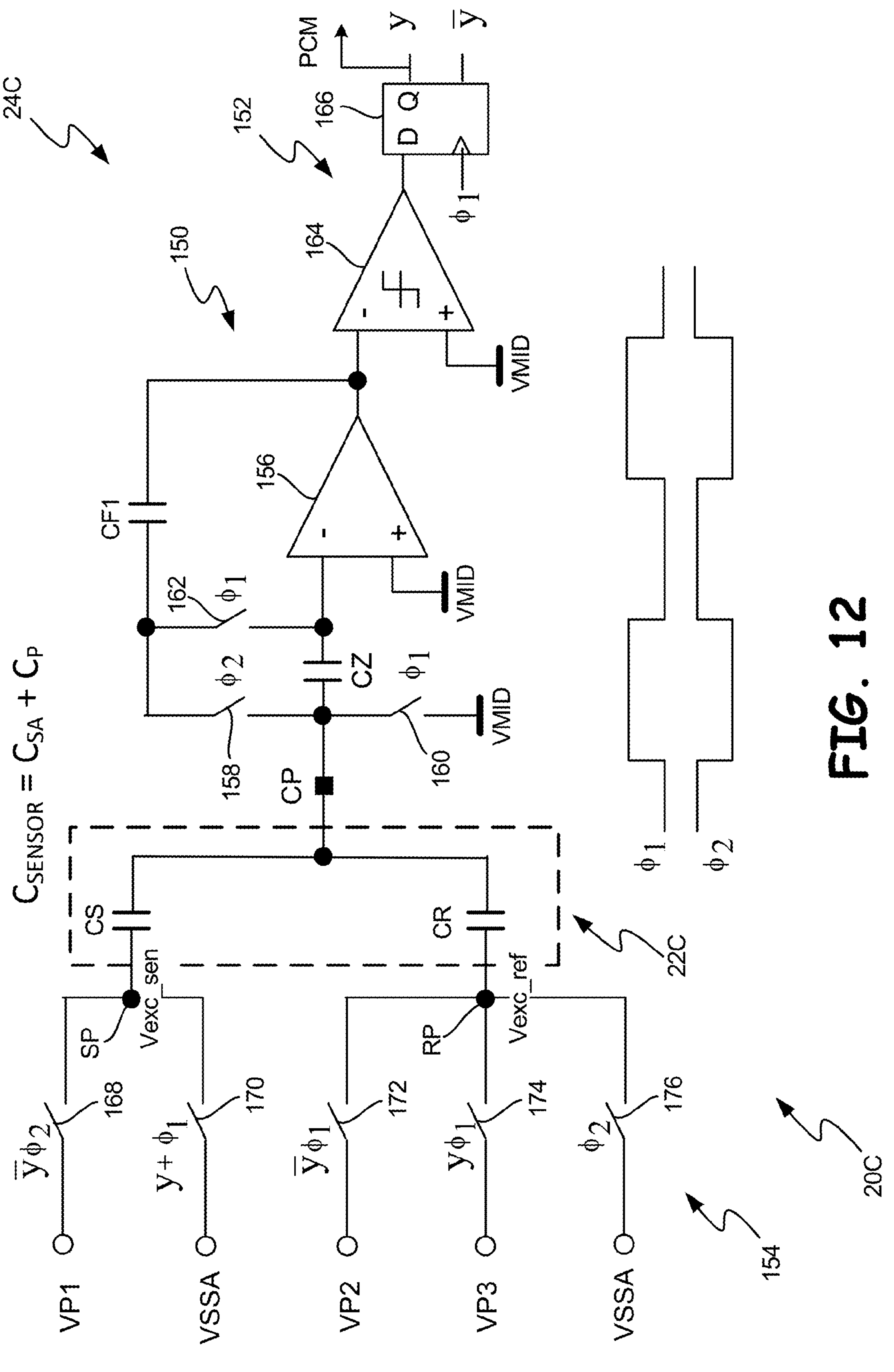
FIG. 12 is a schematic diagram of a first order two-phase sigma delta modulator circuit for measuring $\hat{C}_C/\hat{C}_{SA}$.

The basic circuit implementation for measurement relation (Eq. 25) is shown as FIG. 12. The voltage sources for generating the sensor capacitor excitation signal Vexc_sen and the reference capacitor excitation signal Vexc_ref are separated. Here, VP1 is the voltage source for generating Vexc_sen, VP2 and VP3 are the voltage sources for generating Vexc_ref. Voltage VP1 is the highest, VP2 is the medium and VP3 is the lowest.

FIG. 13 is a simplified circuit for ratio-metric excitation voltage generator. In which VDDP is the voltage supply of the resistor chain (voltage divider 182). The voltage levels of VP1, VP2 and VP3 can be controlled by the injected current from current source 183. The ratio-metric relations among VP1, VP2 and VP3 are specified as $$\frac{VP2}{VP1}=\frac{\hat{C}_C+\hat{C}_P}{\hat{C}_{REF}} \quad \text{(Eq. 29)}$$

-continued $$\frac{VP3}{VP1}=\frac{\hat{C}_C}{\hat{C}_{REF}} \quad \text{(Eq. 30)}$$

For the capacitance sensor 22C (α=0.6) with capacitance parameters as listed in Table 4, the ratio-metric relations are specified as:

$$\frac{VP2}{VP1}=\frac{7}{8} \quad \text{(Eq. 31)}$$

$$\frac{VP3}{VP1}=\frac{1}{2} \quad \text{(Eq. 32)}$$

Note that FIG. 13 assumes that VP1>VP2>VP3. This may not always be true as it depends on the values of the sensor parameters. For other sensor configurations, the order of voltages in FIG. 13 can be re-arranged as needed to implement the circuit.

Charge Balancing Equation and Measurement Relation

Based on switch control logic as marked in FIG. 12, the sensor capacitor excitation signal can be expressed as $$\Delta V_{ex\_sen}=\begin{cases} VP1 & \text{for } y=0 \\ 0 & \text{for } y=1 \end{cases} \quad \text{(Eq. 33)}$$

The reference capacitor excitation signal can be expressed as $$\Delta V_{ex\_ref}=\begin{cases} -VP2 & \text{for } y=0 \\ -VP3 & \text{for } y=1 \end{cases} \quad \text{(Eq. 34)}$$

For y=0, the net charge transferring from the common plate of the sensor bridge to the input node of integrator is $$\Delta Q_{NET}(y=0)=VP1\cdot C_{SENSOR}-VP_2\cdot C_{REF} \quad \text{(Eq. 35)}$$

For y=1, the net charge transferring from the common plate of the sensor bridge to the input node of integrator is $$\Delta Q_{NET}(y=1)=-VP3\cdot C_{REF} \quad \text{(Eq. 36)}$$

Denote $N_0$ as the number of integrator operations of y=0, $N_1$ as the number of integrator operations of y=1, and $N=N_0+N_1$ as the total number of integrator operations, the charge balancing equation can be established as $$N_0\cdot(VP1\cdot\hat{C}_{SENSOR}-VP2\cdot\hat{C}_{REF})-N_1\cdot VP3\cdot\hat{C}_{REF}\approx 0. \quad \text{(Eq. 37)}$$

By substituting the ratio-metric relations of $V_{P2}/V_{P1}$, $V_{P3}/V_{P1}$ and $\hat{C}_{SENSOR}=\hat{C}_{SA}+\hat{C}_P$ into equation (Eq. 37), the charge balance equation can be simplified as:

$$N_0\cdot VP1\cdot\hat{C}_{SA}-N\cdot VP1\cdot\hat{C}_C\approx 0 \quad \text{(Eq. 38)}$$

Here the approximation made is in the sense that the charge difference between initial integrator status and final initial integrator status is ignored. This is a good approximation when N is large.

The charge balancing equation above leads to the required measurement relation $$\eta\equiv\frac{N_1-N_0}{N}\approx 1-2\frac{\hat{C}_C}{\hat{C}_{SA}} \quad \text{(Eq. 39)}$$

The measurement relation above is a linear function of the capacitance ratio $C_C/C_{SA}$. It is exactly the same as specified for the improved modulator circuit (Eq. 25).

Transfer Function Features (1) TF Linearity

By substituting the expression of active sensing capacitance (Eq. 23) into measurement relation (Eq. 39), the transfer function of the optimized modulator circuit is derived as $$\eta \approx (1-2\cdot\hat{C}_C)+2\cdot\alpha\cdot\hat{C}_C\cdot\hat{P}_A \quad \text{(Eq. 40)}$$

It is a linear function of normalized pressure $\hat{P}_A$. In terms of elastic constant α, it can be written as $$\eta \approx -\frac{\alpha}{2-\alpha}+\frac{2\alpha}{2-\alpha}\hat{P}_A \quad \text{(Eq. 41)}$$

For the sensor device with normalized elastic constant α=0.6, the TF expression is $$\eta \approx -3/7+6/7\hat{P}_A \quad \text{(Eq. 42)}$$

(2) TF Dynamic Range

In terms of elastic constant α, the centralized TF dynamic range is derived as $$\eta = \left[-\frac{\alpha}{2-\alpha}, \frac{\alpha}{2-\alpha}\right] \quad \text{(Eq. 43)}$$

For the sensor device with normalized elastic constant α=0.6, the TF dynamic range is $$\eta[-3/7, 3/7] \quad \text{(Eq. 44)}$$

(3) TF Sensitivity

TF sensitivity κ is defined as first order derivative of η with respect to $\hat{P}_A$. From (Eq. 41), it can be derived as $$\kappa = \frac{2\cdot\alpha}{2-\alpha} \quad \text{(Eq. 45)}$$

For sensor device with normalized elastic constant as α=0.6, the TF sensitivity is $$\kappa = 6/7 = 0.857143 \quad \text{(Eq. 46)}$$

(4) TF Plot

Figure 14:
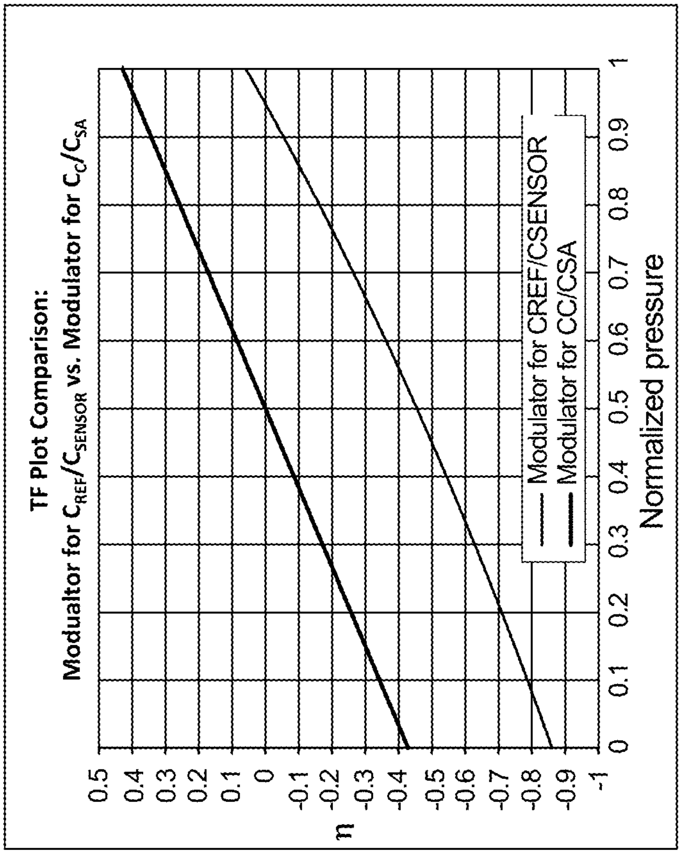
FIG. 14 is a transfer function plot showing a comparison of function plots for a sigma delta modulator for measuring $\hat{C}_{REF}/\hat{C}_{SENSOR}$ versus a sigma delta modulator for measuring $\hat{C}_C/\hat{C}_{SA}$.

The TF plot for the example sensor device as in Table 1 is shown in FIG. 14, in which one line is the TF plot for the modulator measuring $C_C/C_{SA}$, while the other line is the transfer function plot for the modulator measuring $C_{REF}/C_{SENSOR}$. The $C_C/C_{SA}$ line is linear with centralized TF dynamic range as [−0.4286, 0.4286], while the $C_{REF}/C_{SENSOR}$ line is non-linear with non-centralized TF dynamic range as [−0.8605, 0.0588]. The modulator for measuring $C_C/C_{SA}$ (such as modulator 24C of FIG. 12) shows significant improvement both in TF linearization and TF dynamic range centralization.

Sensor Excitation Voltage Level

The maximum excitation voltage is limited by the spike voltage at the input terminal CP. If the spike voltage at input terminal CP in FIG. 12 exceeds the rails, the leakage effect at the input terminal may introduce measurement errors. The spike voltage ratio can be estimated as follows:

$$\frac{|V_{SPIKE}|}{VP1} = \begin{cases} \dfrac{\hat{C}_{SA}-\hat{C}_C}{\hat{C}_{SA}+\hat{C}_P+\hat{C}_{REF}} & \text{for } y=0 \\ \dfrac{\hat{C}_C}{\hat{C}_{SA}+\hat{C}_P+\hat{C}_{REF}} & \text{for } y=1 \end{cases} \quad \text{(Eq. 47)}$$

$V_{SPIKE}$ is the amplitude of the voltage spike that is originating at half of VDDA, so in order to avoid spiking over (or under) the rail $V_{SPIKE}$ must be less than VDDA/2. For the example sensor with parameter as listed in Table 4, the plots of the spike ratio (Eq. 47) as a function of normalized pressure are shown as FIG. 15. In which, one line is the plot for y=0, and the other line is the plot for y=1. The maximum spike voltage ratio is found as 0.4 located at full scale pressure for the operation of y=0. Therefore, the excitation voltage source VP1 can be raised to the same voltage level as analog supply VDDA without causing an input terminal leakage issue. The corresponding ratio-metric excitation voltage sources for the example sensor are:

$$VP1=VDDA, VP2=7/8VDDA, VP2=1/2VDDA. \quad \text{(Eq. 48)}$$

Second Order Modulator Circuit for Measuring $C_C/C_{SA}$—Sensor Circuit 20D (FIGS. 16-17)

FIG. 16 is the schematic of a second order modulator circuit that can serve for the measurement of capacitance ratio $C_C/C_{SA}$. It can also serve for the measurement of capacitance ratio $C_{REF}/C_{SENSOR}$, if the excitation V-source VSSA is replaced by VN, and VP1, VP2, VP3 are replaced by VP. When the modulator circuit FIG. 16 is in the operation mode for measuring $C_C/C_{SA}$, the function of parasitic compensation will be active, at the same time, the function of TF dynamic range centralization will be effective. The TF of circuit 20D will be the same as the TF of circuit 20C in FIG. 12. FIGS. 14 and 15 are also applicable to circuit 20D.

FIG. 16 shows sensor circuit 20D, which includes sensor 22D and C/D sigma delta modulator 24D. Modulator 24D is similar to modulator 24B shown in FIG. 8, except that it makes use of the ratio-metric excitation voltage generation feature of modulator 24C, as illustrated in FIGS. 12 and 13. In particular, modulator 24D includes first stage integrator 90, second stage integrator 92, and quantizer 94 in conjunction with excitation voltage generator 154 of modulator 24C. Similar elements are designated with similar reference numerals and characters found in FIGS. 8 and 12.

Modulator Simulations with VP1=VDDA

Simulations have been made for the modulator circuit schematic shown as FIG. 16. The simulations were conducted in transistor level. The analog supply voltage is VDDA=2.4V. The ratio-metric voltage sources are VP1=2.4V, VP2=2.1V, VP3=1.2V. The capacitance parameters in the simulations for $\hat{P}_A$=0 for $\hat{P}_A$=0.5 and $\hat{P}_A$=1.0 are listed in Table 5, in which the values in the column "expected η" is obtained from TF expression (Eq. 42).

The waveforms of first stage integrator 90 are shown as FIGS. 17A-17C, which can be illustrated as follows.

Figure 17A:
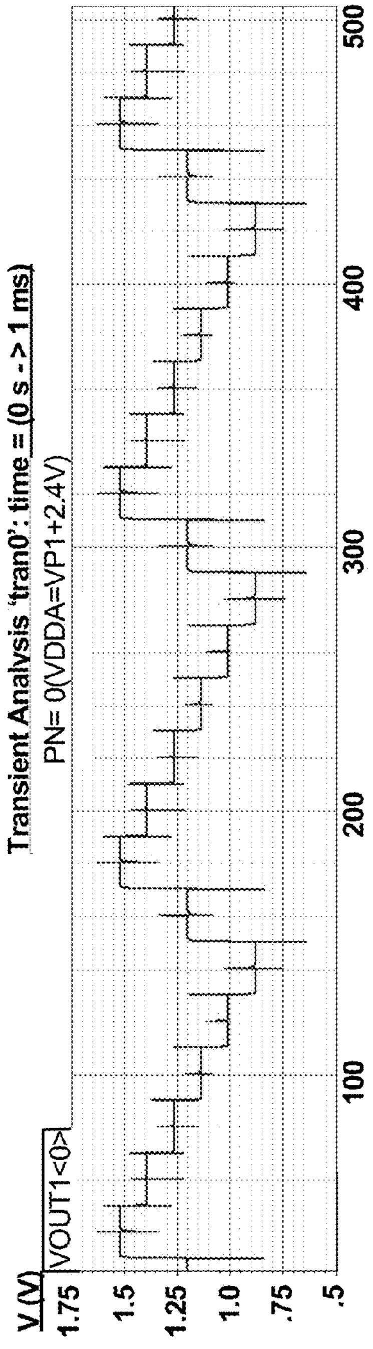
FIGS. 17A-17C show waveforms of the first stage integrator of the sigma delta modulator of FIG. 16.
Figure 18:
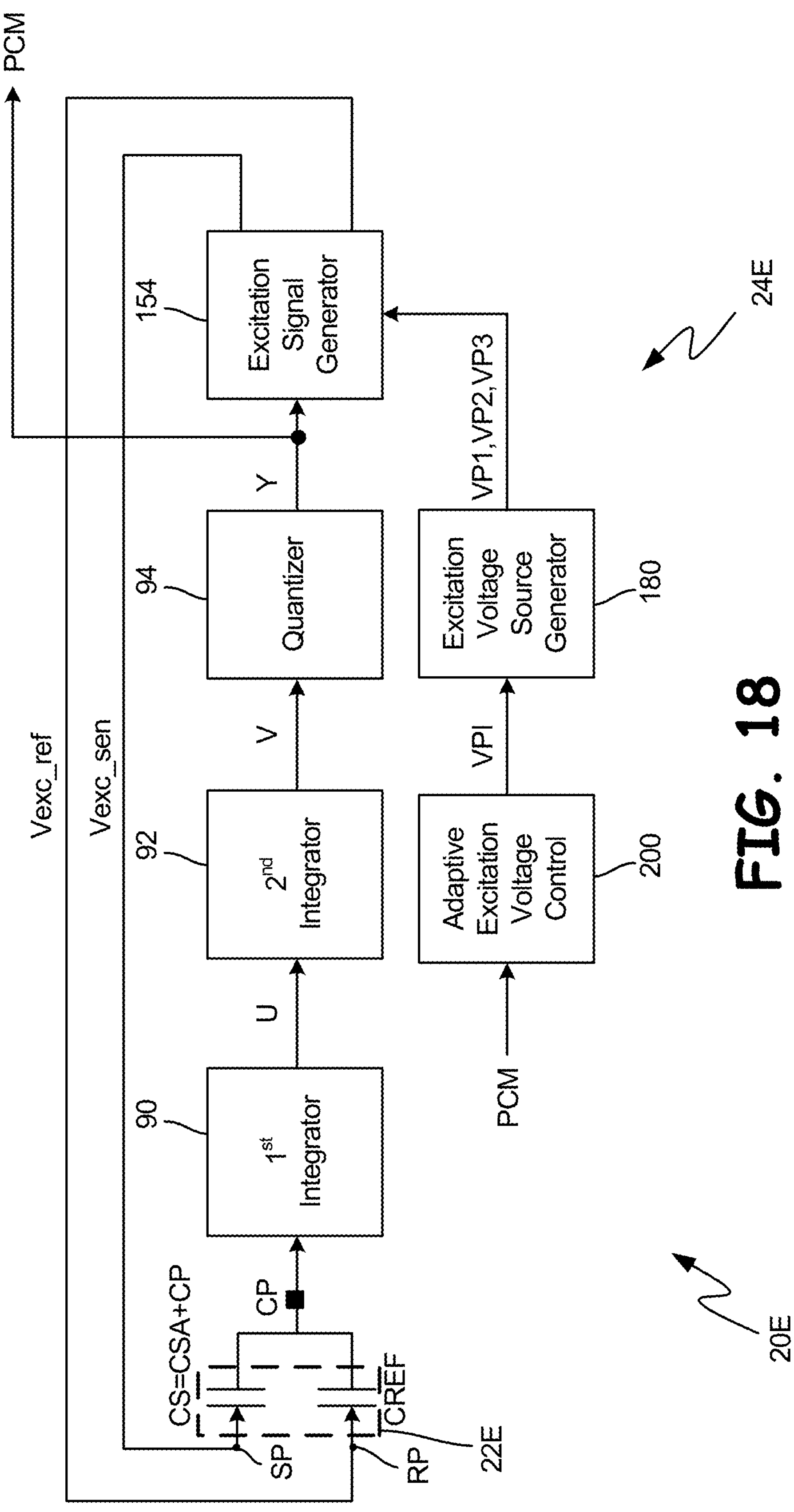
FIG. 18 is a block diagram showing a second order two-phase sigma delta modulator circuit similar to the circuit of FIG. 16 but also including adaptive excitation voltage control.

FIG. 17A is the waveform for $\hat{P}_A$=0. It shows that five integrator operations of y=0 (down-step) are balanced by two integrator operations of y=1 (up-step). This means η=−3/7, and it matches with expectation.

Figure 17B:
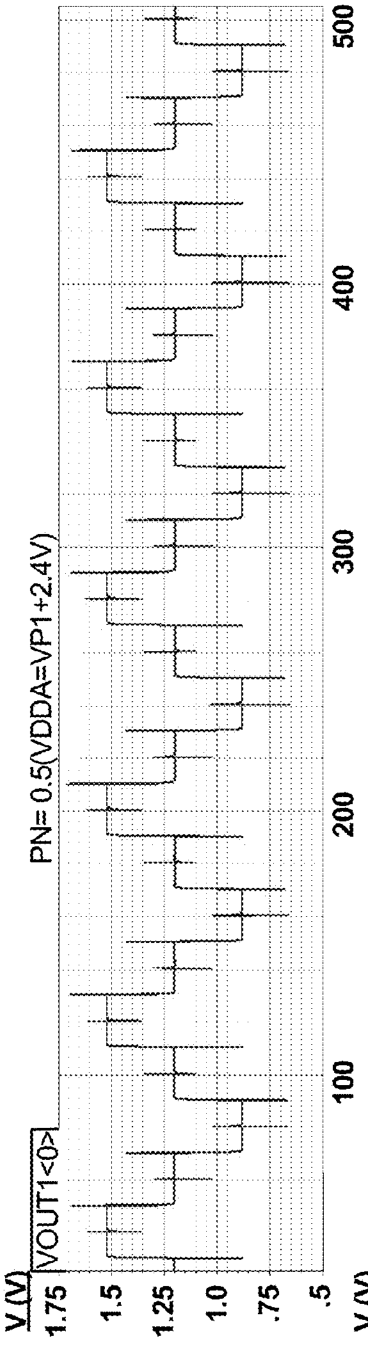
Figure 17C:
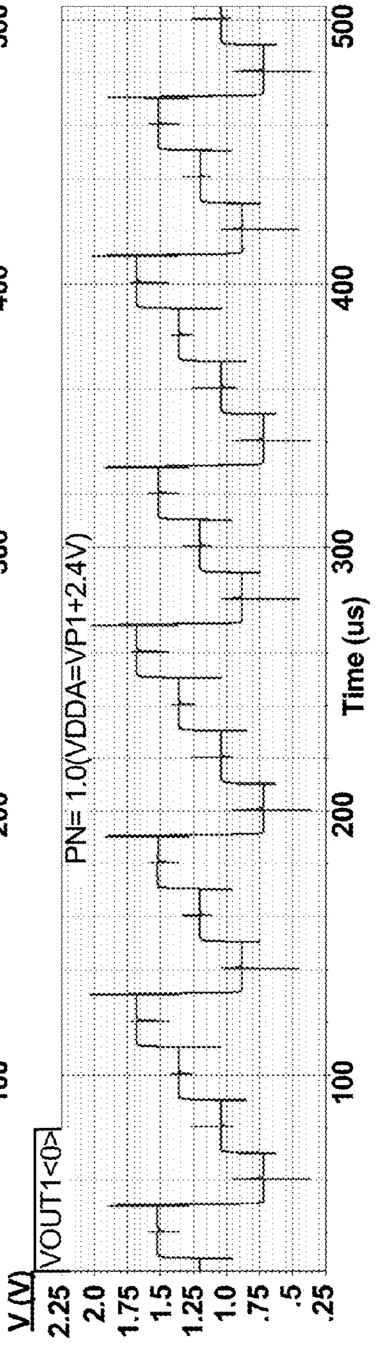

FIG. 17B is the waveform for $\hat{P}_A$=0.5. It shows that two integrator operations of y=0 (down-step) are balanced by two integrator operations of y=1 (up-step). This means η=0, and it matches with expectation.

FIG. 17C is the waveform for $\hat{P}_A$=1.0. It shows that two integrator operations of y=0 (down-step) are balanced by five integrator operations of y=1 (up-step). This means $\eta=3/7$, and it matched with expectation.

TABLE 5

| Capacitance parameters in the simulations | | | | |
|---|---|---|---|---|
| $\hat{P}_A$ | $\hat{C}_{SA}$ | $\hat{C}_P$ | $\hat{C}_{REF}$ | Expected $\eta$ |
| 0 | 1.000 | 0.5357 | 1.4286 | $-3/7$ |
| 0.5 | 1.4286 | 0.5357 | 1.4286 | 0 |
| 1.0 | 2.500 | 0.5357 | 1.4286 | $+3/7$ |

Modulator with Adaptive Excitation Voltage Control Sensor Circuit 20E (FIGS. 18-19B).

From the plots in FIG. 15 we also see that the spike voltage ratio at zero $\hat{P}_A$ is only 0.096 for y=0, and 0.241 for y=1. Therefore, it is feasible to raise the excitation voltage source VP1 to the level of 2*VDDA when $\hat{P}_A$ measurement results approaches to zero. The spike voltage $V_{SPIKE}$ will still be less than VDDA/2 so there will be no pin leakage issues. By doing that the S/N ratio (signal-to-noise ratio) at zero $\hat{P}_A$ will be significantly improved. This leads to the concept of adaptive excitation.

In the modulator for measuring $C_C/C_{SA}$, the adaptive excitation is achieved by control of the excitation voltage source VP1. For the example sensor device with parameters as listed in Table 5, the adaptive control algorithm can be expressed as $$V_{P1}(\hat{P}_A)=(2-\langle\hat{P}_A\rangle)\cdot VDDA \quad \text{(Eq. 49)}$$

In which ($\hat{P}_A$) represents the measured normalized pressure. When the measured normalized pressure ($\hat{P}_A$) is approaching to 1.0, the voltage VP1 is approaching to VDDA. When the measured normalized pressure ($\hat{P}_A$) is approaching to 0, voltage VP1 is approaching to 2*VDDA. At the same time, when VP1 is varying, VP2 and VP3 will follow, such that their ratio-metric relations (Eq. 29-Eq. 30) keep the same. By implementing the adaptive excitation algorithm as described, the S/N ratio is increased for lower pressure region, and the corresponding measurement resolution is improved.

FIG. 18 shows sensor circuit 20E in block diagram form. Sensor circuit 20E includes capacitance sensor 22E and C/D sigma delta modulator 24E.

Modulator 24E is similar to modulator 24B shown in FIG. 16. It includes first stage integrator 90, second stage integrator 92, quantizer 94, excitation signal generator 154, and excitation voltage source generator 180 (shown in FIG. 13). In addition, modulator 24E includes adaptive excitation voltage control 200, which varies voltage VP1 as a function of the PCM output of quantizer 94. Alternatively, adaptive excitation voltage control can vary voltage using automatic gain control. The voltage can be varied by changing the current flowing through voltage divider 182. As VP1 is varied, voltages VP2 and VP3 are also varied, because excitation voltage source generator 180 produces voltages VP2 and VP3 as fixed ratios of voltage VP1.

Simulations have also been made for modulator circuit 20E with adaptive excitation voltage sources. The analog supply is set as VDDA=2.4V. The excitation voltages sources VP1, and VP3 are set according to the adaptive control algorithm (Eq. 49) and the ratio-metric relations (Eq. 31 and Eq. 32). The corresponding parameters are listed in Table 6 for normalized pressure $\hat{P}_A$=0, $\hat{P}_A$=0.5 and $\hat{P}_A$=1.0.

Figure 19A:
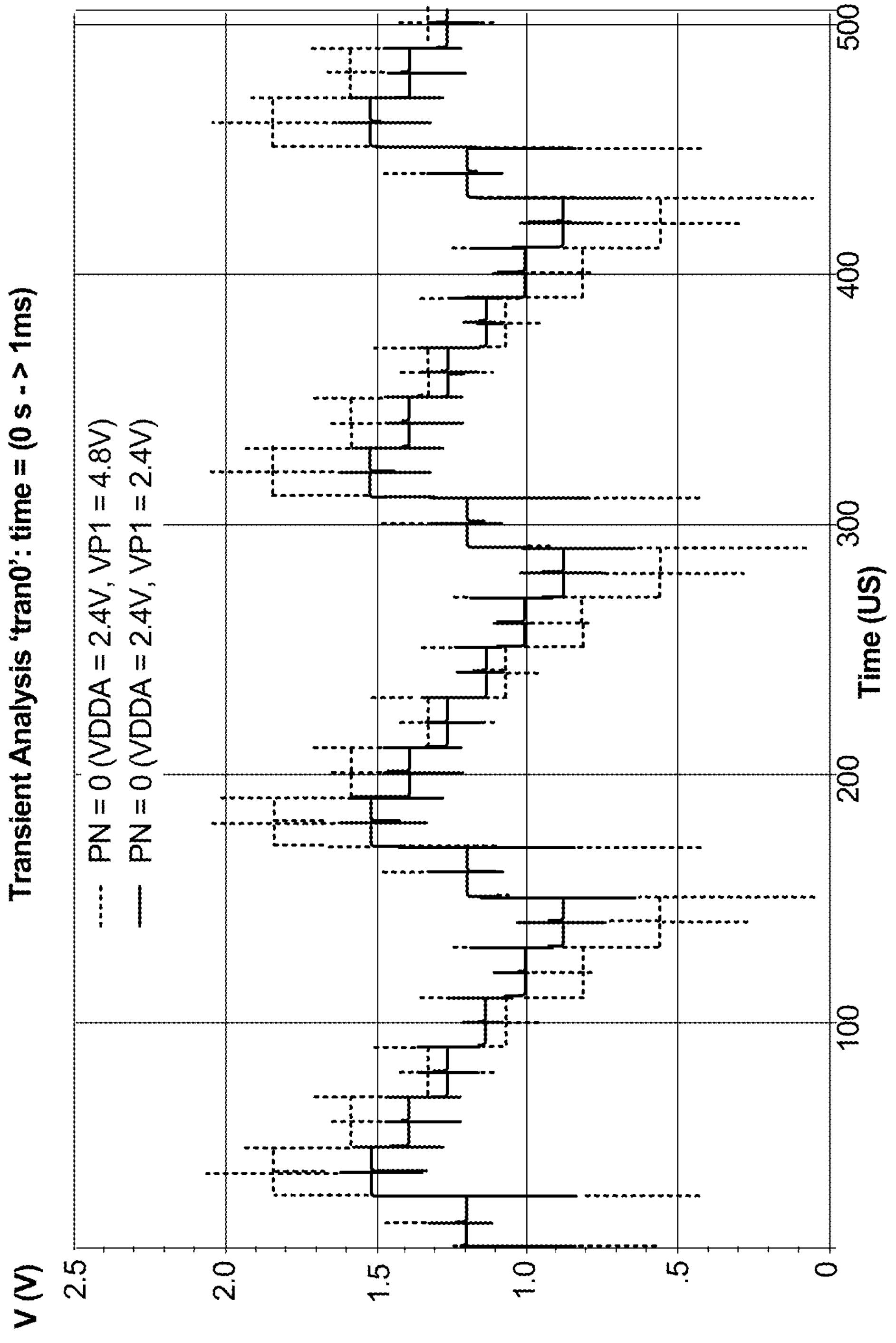
FIGS. 19A and 19B each show waveforms of the output of the first stage integrator of the modulator circuit of FIG. 18 with two different sets of excitation voltages, and with FIG. 19A representing one pressure and FIG. 19B representing another pressure.
Figure 19B:
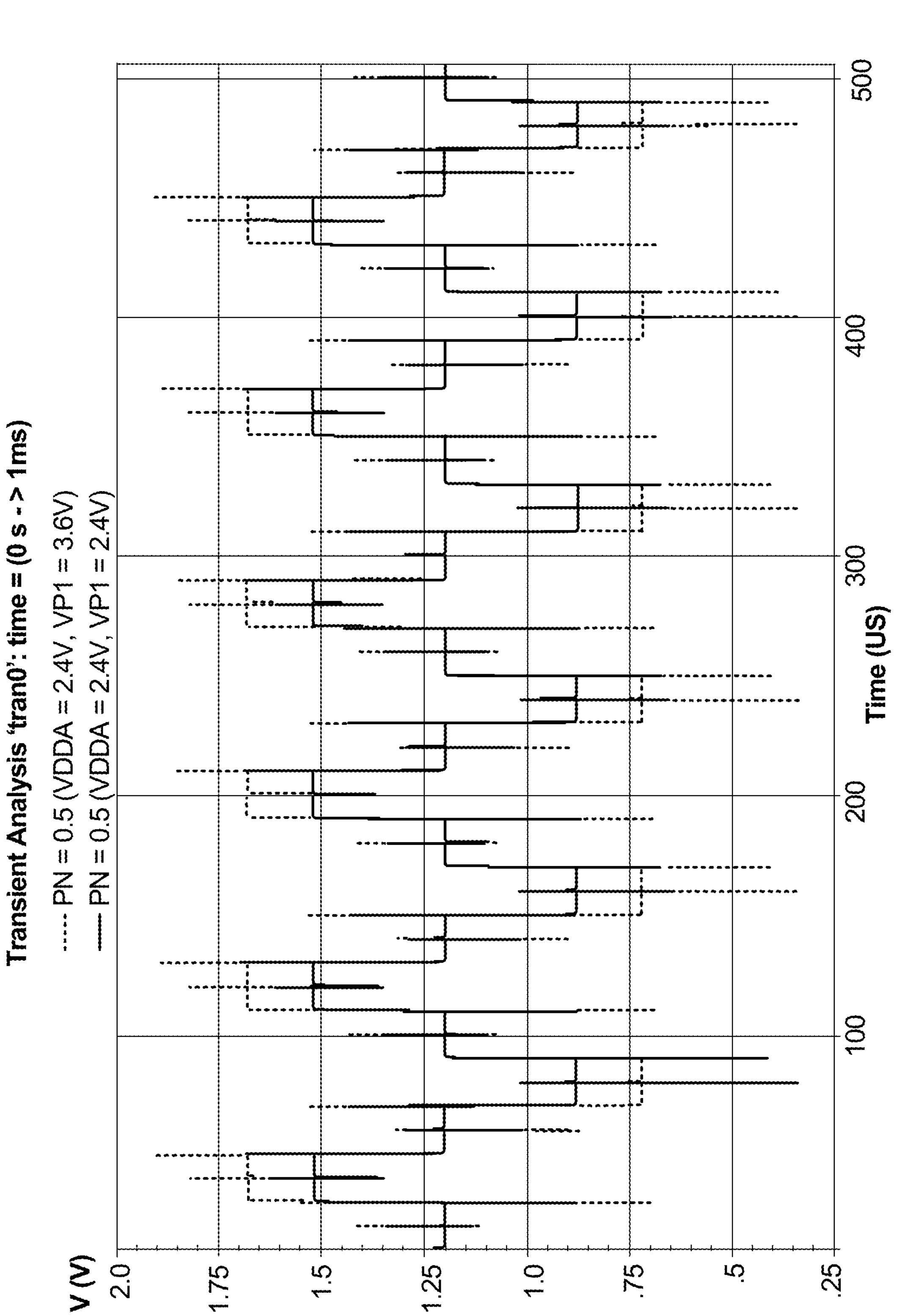

The waveform of first stage integrator 90 of sensor circuit 20E for the case of $\hat{P}_A$=0 is shown as FIG. 19A. The dotted line is waveform with adaptive voltage sources as VP1=4.8V VP2=4.2V, VP3=2.4V. The solid line is the same waveform shown as FIG. 17A. The patterns of the two waveforms remain the same, while the signal of the dotted line is enhanced by a factor of 2. Therefore signal-to-noise ratio is improved by a factor of 2.

The waveform of first stage integrator 90 of sensor circuit 20E for the case of 0.5 is shown as FIG. 19B. The dotted line is waveform with adaptive voltage sources as VP1=3.6V VP2=3.15V, VP3=1.8V. The solid line is the same waveform shown in FIG. 17B. The patterns of the two waveforms are remained the same, while the signal of the dotted line is enhanced by a factor 1.5. Therefore signal-to-noise ratio is improved by a factor of 1.5.

For the case of $\hat{P}_A$=1.0, the excitation voltage sources are the same as in sensor circuit 20E, the waveform remains the same in FIG. 17C.

TABLE 6

| VDDA and adaptive V-sources (VP1, VP2, VP3) in the simulations | | | | | |
|---|---|---|---|---|---|
| $\hat{P}_A$ | VDDA (V) | VP1 (V) | VP2 (V) | VP3 (V) | Expected $\eta$ |
| 0 | 2.40 | 4.80 | 4.20 | 2.40 | $-3/7$ |
| 0.5 | 2.40 | 3.60 | 3.15 | 1.80 | 0 |
| 1.0 | 2.40 | 2.40 | 2.10 | 1.20 | $+3/7$ |

The modulator circuits 24C, 24D, and 24E can serve for the measurement of capacitance ratio $C_C/C_{SA}$. They can also serve for the measurement of capacitance ratio $C_{REF}/C_{SENSOR}$. When the modulator is in the mode for the measurement of capacitance ratio $C_C/C_{SA}$, the function of parasitic compensation will be active, at the same time, the function of TF dynamic range centralization will be effective. Modulator circuits 24C-24E described in this disclosure feature parallel parasitic capacitance compensation, transfer function linearization, transfer function dynamic range centralization, and modulator operation optimization. These circuits also feature higher excitation level and adaptive excitation level for further resolution improvement at lower absolute pressure.

While the invention has been described with reference to an exemplary embodiment(s), it will be understood by those skilled in the art that various changes may be made and equivalents may be substituted for elements thereof without departing from the scope of the invention. For example, although embodiments were described specifically in the context of pressure measurements, the sensor circuits are applicable to a wide range of other sensing applications, such as acceleration, flow, humidity, proximity, angle, rotation, and biological sensing. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A sensor circuit comprising:

a capacitance sensor that includes a sensor capacitor and a reference capacitor, a sensor plate terminal connected to the sensor capacitor, a reference plate terminal connected to the reference capacitor, and a common plate terminal connected to both the sensor capacitor and the reference capacitor, wherein spacing between the sensor plate terminal and the common plate terminal change in relation to a sensed parameter; and a capacitance-to-digital sigma delta modulator that includes an integrator having an input connected to the common plate terminal and an output, a quantizer connected to the output of the integrator that produces a pulse code modulated output signal, and an excitation signal generator that provides a sensor excitation signal to the sensor plate terminal and a reference excitation signal to the reference plate terminal.

2. The sensor circuit of claim 1, wherein the integrator comprises a first stage integrator connected to the input.

3. The sensor circuit of claim 2, wherein the integrator comprises a second stage integrator connected between the first stage integrator and the output.

4. The sensor circuit of claim 1, wherein the modulator further comprises an excitation voltage source generator that provides a plurality of excitation voltages to the excitation signal generator.

5. The sensor circuit of claim 4, wherein excitation voltage source generator provides a first voltage, a second voltage, a third voltage, and a fourth voltage to the excitation signal generator.

6. The sensor circuit of claim 5, wherein the excitation signal generator provides the sensor excitation signal based upon the first voltage, the second voltage, output states of the quantizer, and clock signals.

7. The sensor circuit of claim 6, wherein the excitation signal generator provides the reference excitation signal based upon the second voltage, the third voltage, the fourth voltage, the output states of the quantizer, and the clock signals.

8. The sensor circuit of claim 7, wherein the first voltage is greater than the third voltage, the third voltage is greater than the fourth voltage, and the fourth voltage is greater than the second voltage.

9. The sensor circuit of claim 5, wherein the excitation voltage source generator comprises a voltage divider.

10. The sensor circuit of claim 5, wherein the excitation voltage source generator provides programmable ratio-metric excitation voltages.

11. The sensor circuit of claim 4, wherein the modulator further comprises an adaptive excitation voltage control connected to the excitation voltage source generator that varies the excitation voltages provided by the excitation voltage source generator.

12. The sensor circuit of claim 1, wherein the sensor capacitor and the reference capacitor share a common plate, and wherein the common plate terminal is connected to the common plate.

13. The sensor circuit of claim 12, wherein the capacitance sensor is an absolute pressure sensor.

14. The sensor circuit of claim 1, wherein the modulator is a two-phase sigma delta modulator.

15. The sensor circuit of claim 1, wherein the capacitance-to-digital sigma delta modulator produces an output representative of $C_{REF}/C_{SENSOR}$, where $C_{REF}$ is capacitance of the reference capacitor and $C_{SENSOR}$ is capacitance of the sensor capacitor.

16. The sensor circuit of claim 1, wherein the capacitance-to-digital sigma delta modulator produces an output representative of $C_C/C_{SA}$, where $C_{SA}$ is an active sensing capacitance of the sensor capacitor, and where $C_C$ is a characteristic capacitance defined as $$C_C \equiv \frac{C_1 \cdot C_0}{C_1 + C_0},$$

where $C_1$ is $C_{SA}$ at a maximum normalized sensed parameter and $C_0$ is $C_{SA}$ at a minimum normalized sensed parameter.

17. The sensor circuit of claim 1, wherein the capacitance sensor is a terminal displacement capacitance sensor.

* * * * *